(12) United States Patent
Yaegashi et al.

(10) Patent No.: US 7,436,714 B2
(45) Date of Patent: Oct. 14, 2008

(54) NONVOLATILE SEMICONDUCTOR MEMORY

(75) Inventors: Toshitake Yaegashi, Yokohama (JP); Kenji Sawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/741,936

(22) Filed: Apr. 30, 2007

(65) Prior Publication Data

US 2007/0279986 A1   Dec. 6, 2007

(30) Foreign Application Priority Data

May 31, 2006   (JP)   ............... 2006-152767

(51) Int. Cl.
*G11C 16/04*   (2006.01)
(52) U.S. Cl. .................. 365/185.28; 365/185.17; 365/185.22
(58) Field of Classification Search .............. 365/185.28
See application file for complete search history.

(56) References Cited

U.S. PATENT DOCUMENTS

| 5,621,684 | A | | 4/1997 | Jung | |
|---|---|---|---|---|---|
| 6,091,640 | A | * | 7/2000 | Kawahara et al. | 365/185.28 |
| 6,859,394 | B2 | * | 2/2005 | Matsunaga et al. | 365/185.17 |
| 2008/0043528 | A1 | * | 2/2008 | Isobe et al. | 365/185.03 |

FOREIGN PATENT DOCUMENTS

| JP | 11-219595 | 8/1999 |
|---|---|---|
| JP | 2005-327436 | 11/2005 |

* cited by examiner

*Primary Examiner*—Son L Mai
(74) *Attorney, Agent, or Firm*—Oblon, Spivak, McClelland, Maier & Neustadt, P.C.

(57) ABSTRACT

A nonvolatile semiconductor memory according to examples of the present invention includes a NAND string comprised memory cells connected in series, two select gate transistors each of which is connected to each end of the NAND string, and a write control circuit which makes a first write condition for a selected cell different from a second write condition for the selected cell. The first write condition is that the selected cell is one of two memory cells adjacent to the two select gate transistors. The second write condition is that the selected cell is one of the memory cells except for two memory cells adjacent to the two select gate transistors.

20 Claims, 26 Drawing Sheets

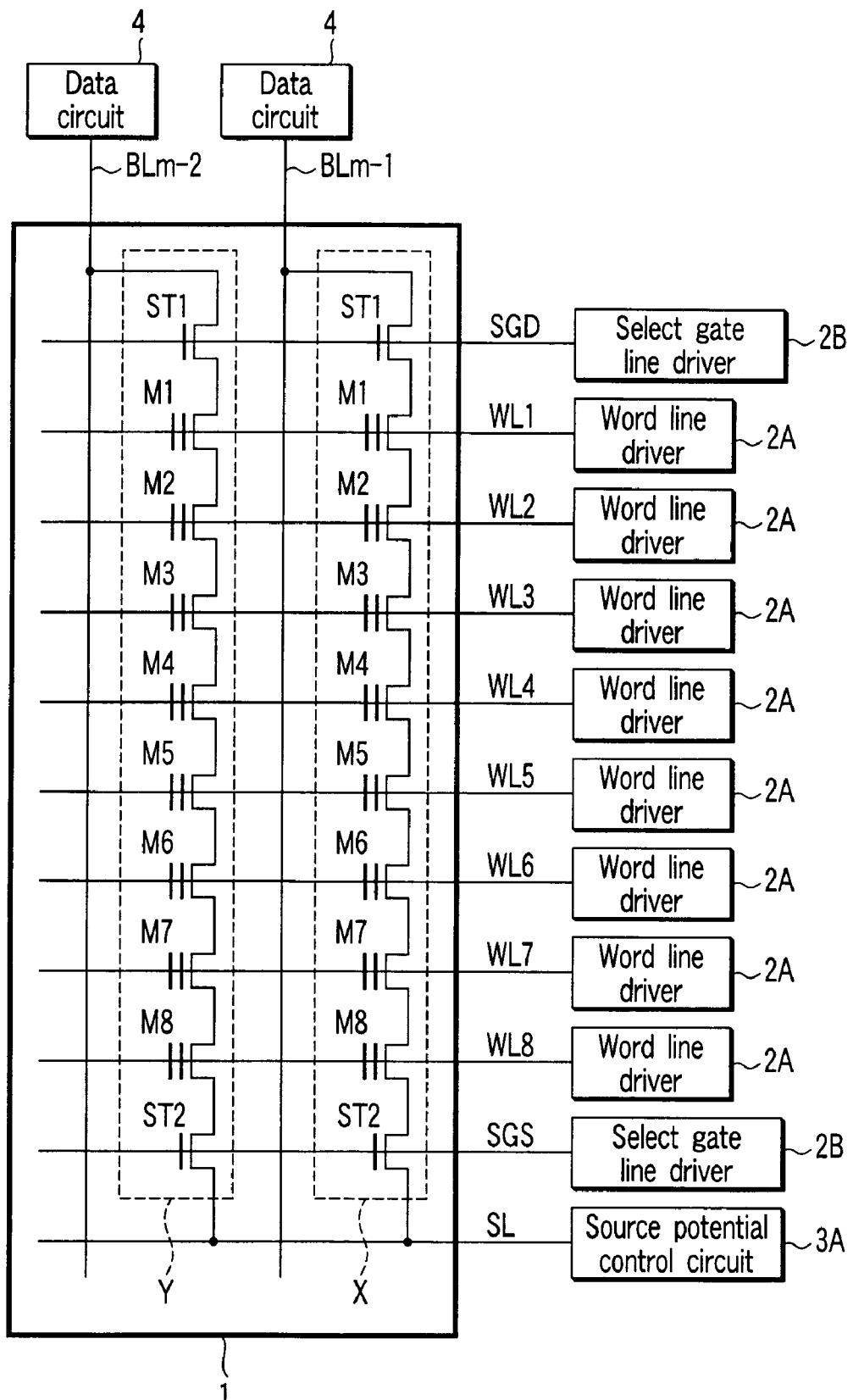
F I G. 1

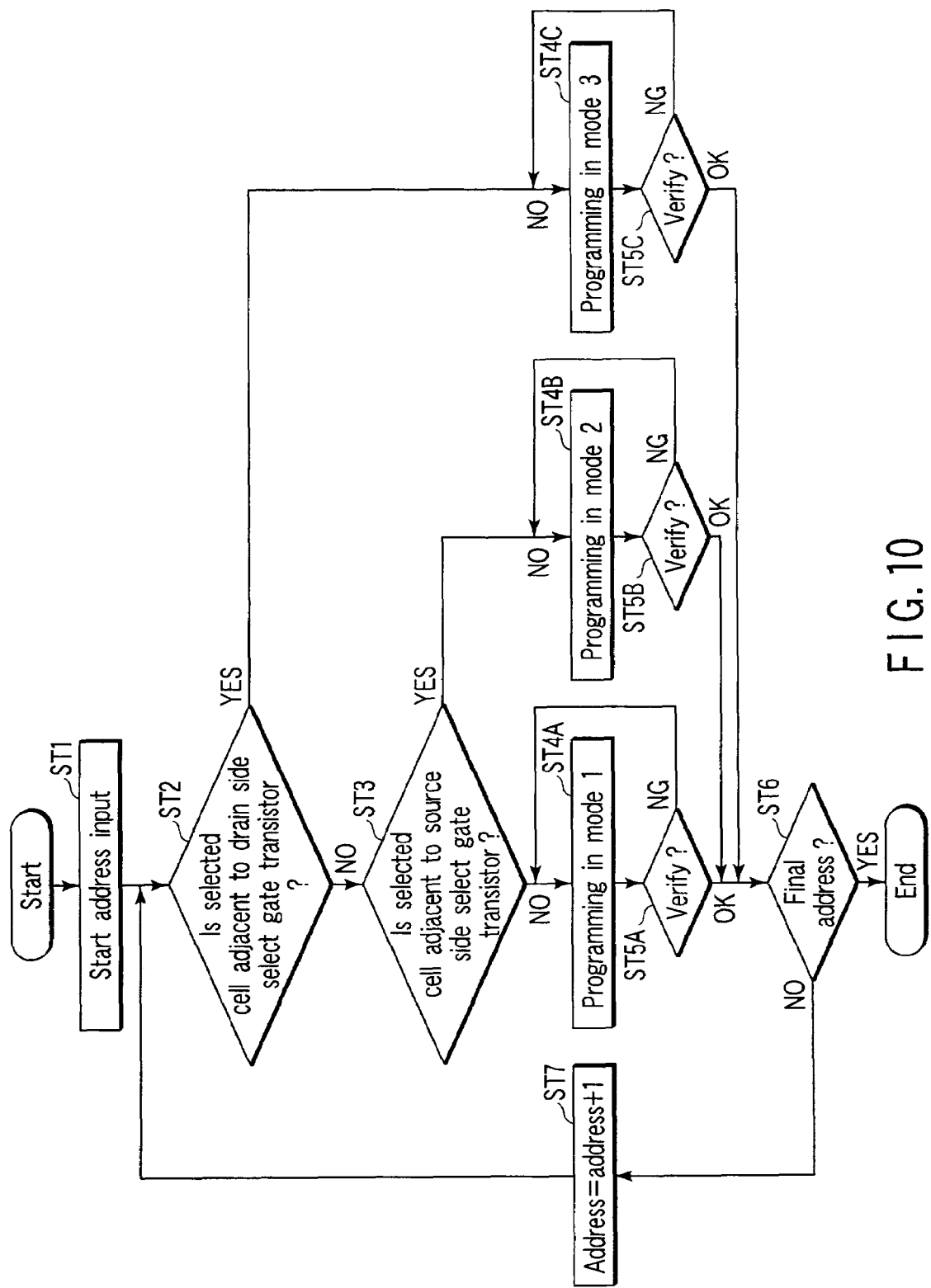
F I G. 10

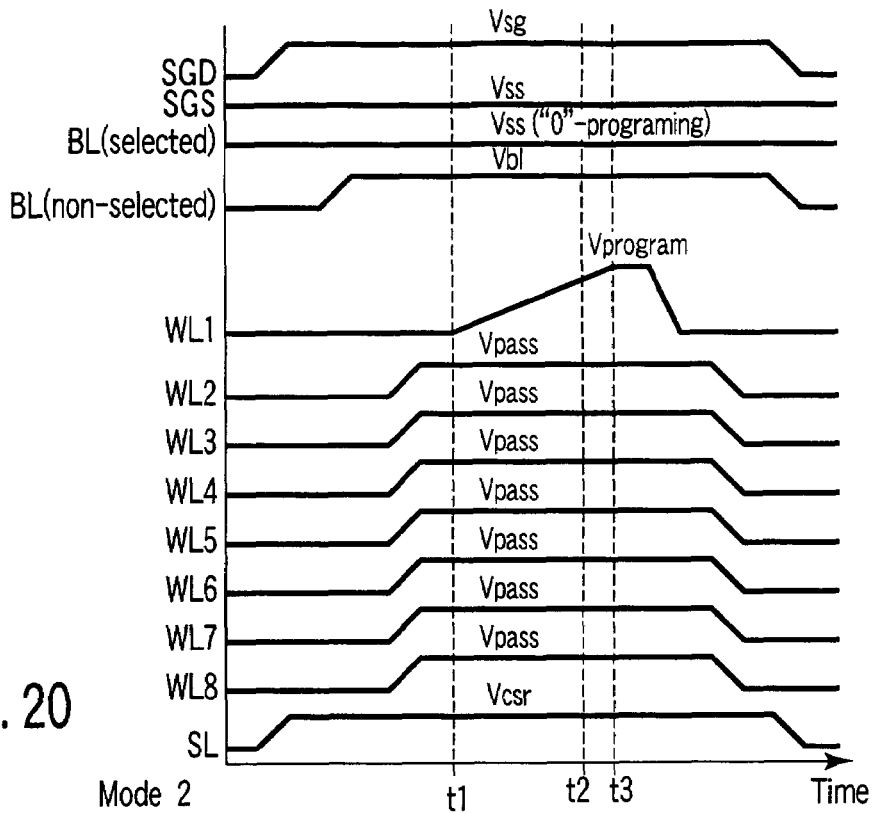
F I G. 20
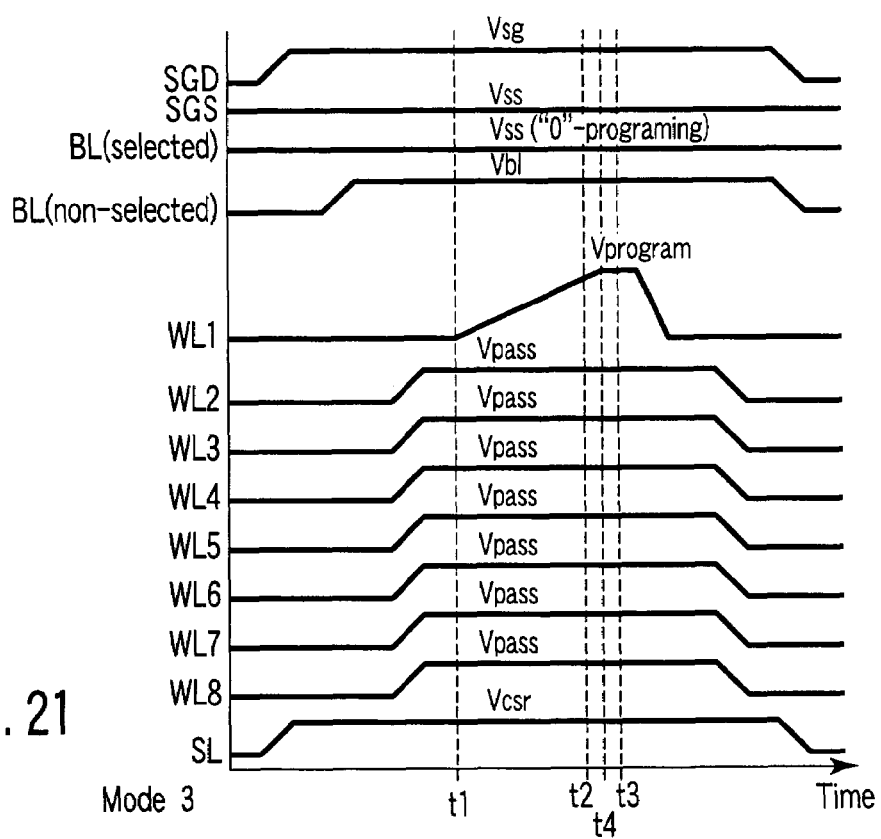
F I G. 21

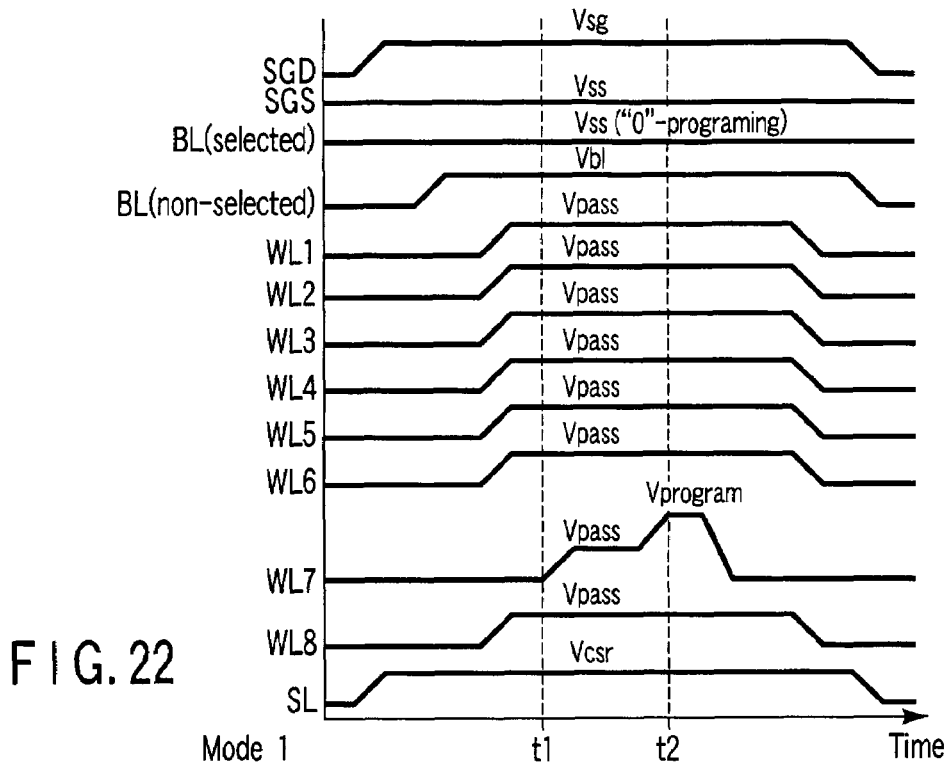
F I G. 22
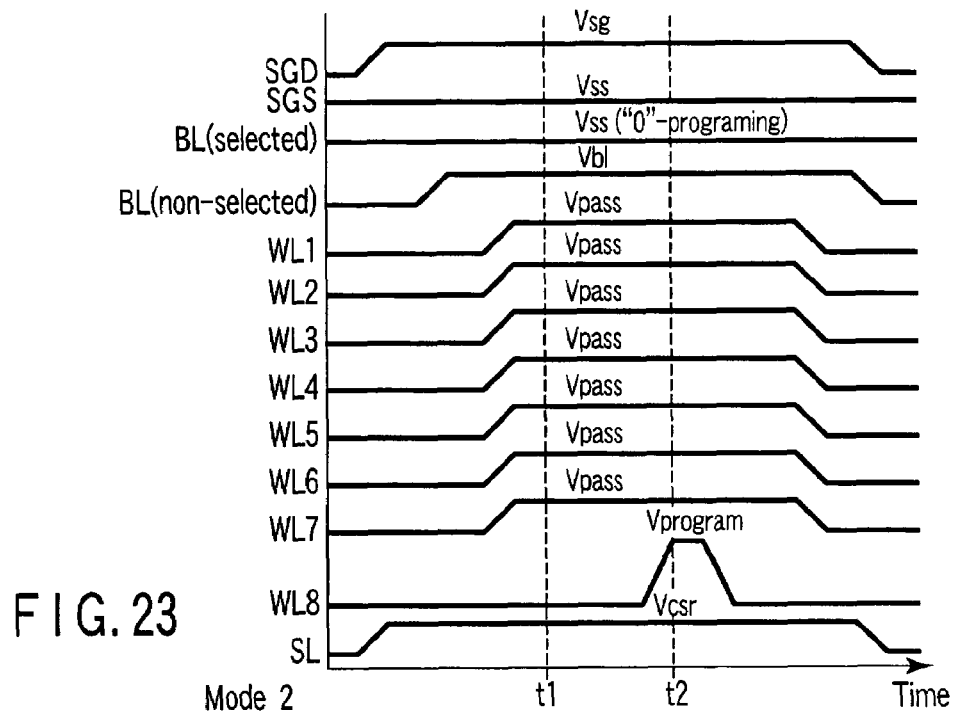
F I G. 23

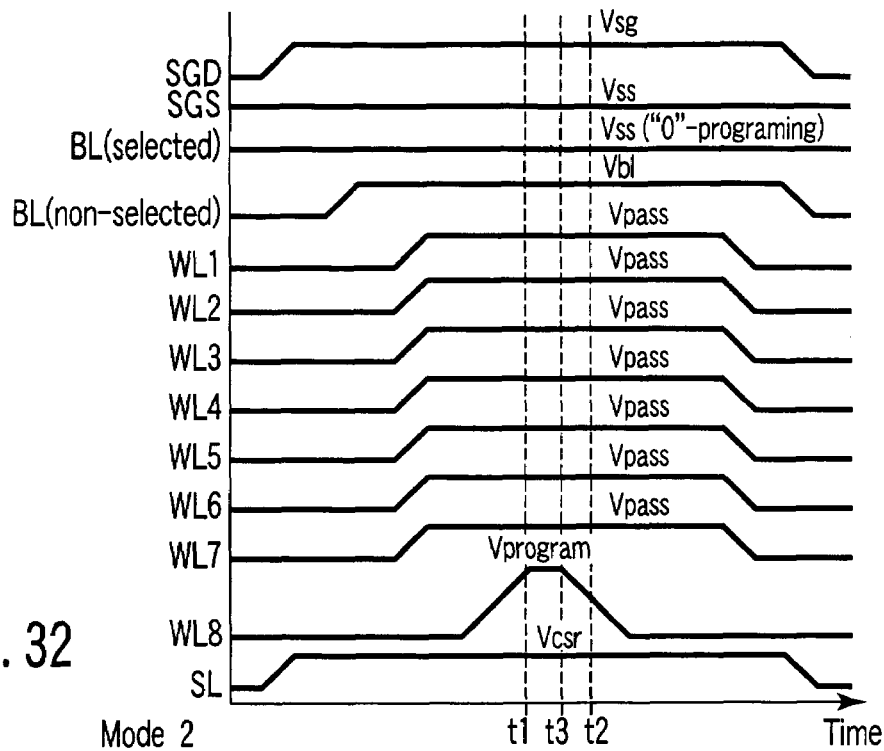
F I G. 32
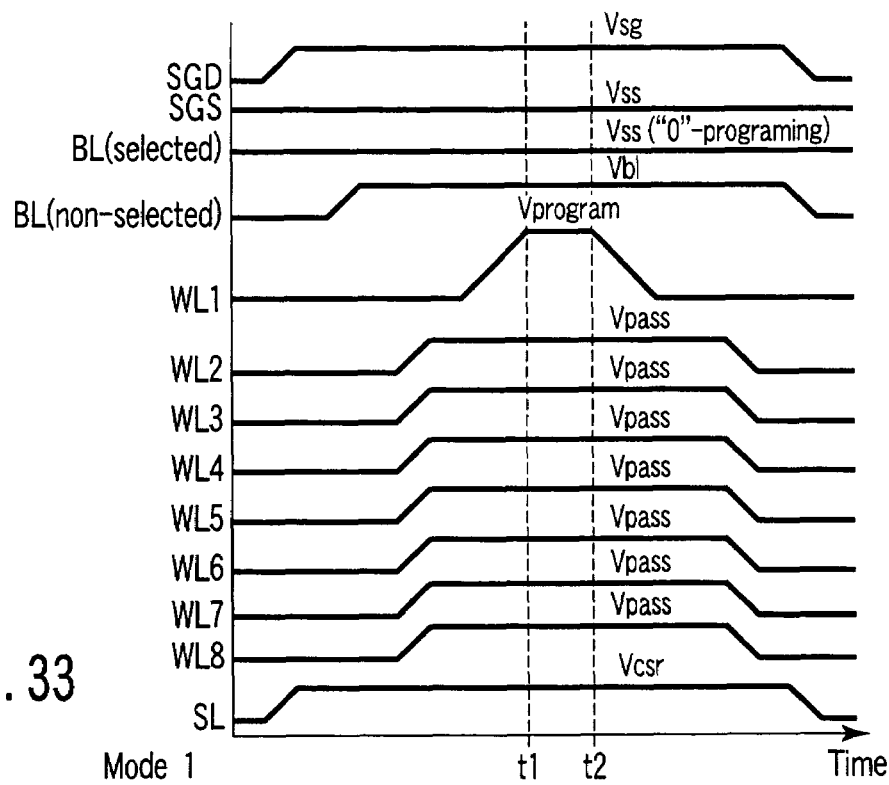
F I G. 33

NONVOLATILE SEMICONDUCTOR MEMORY

CROSS-REFERENCE TO RELATED APPLICATIONS

This application is based upon and claims the benefit of priority from prior Japanese Patent Application No. 2006-152767, filed May 31, 2006, the entire contents of which are incorporated herein by reference.

BACKGROUND OF THE INVENTION

1. Field of the Invention

The present invention relates to a write operation of a nonvolatile semiconductor memory, for instance, a NAND type flash memory.

2. Description of the Related Art

A NAND type flash memory, in recent years, is used for various kinds of electronic devices while making the best use of its increased capacity and a nonvolatile property.

A cell unit of the NAND type flash memory is comprised a NAND string comprised a plurality of memory cells connected serially, and two select gate transistors each of which is connected to each end of the NAND string.

The memory cell has a stack gate structure consisting of a control gate electrode and a floating gate electrode. The control gate electrode of the memory cell is connected to a word line, while a gate electrode of the select gate transistor is connected to a select gate line.

A drain region arranged at one end of the cell unit is connected to a bit line, while a source region arranged at the other end is connected to a source line.

Then, at the time of write operation, a non-selected word line is made to be at a pass potential, while a selected word line is made to be at a write potential. A piece of write data (ground potential) is transferred from the selected bit line to a channel of a selected cell.

As a result, a high electric field is generated in a tunnel insulating film between the channel of the selected cell and the floating gate electrode, and electrons are injected in the floating gate electrode of the selected cell by FN (Fowler-Nordheim) tunneling phenomenon.

At this time, in the cell unit connected to the non-selected bit line, since two select gate transistors are in the OFF-state, when making the non-selected word line the pass potential, and making the selected word line the write potential, a channel potential of the memory cell constituting the NAND string increases.

Therefore, write for the non-selected cell in the cell unit connected to the non-selected bit line is inhibited in the state that the high electric field is not generated at the tunnel insulating film between the channel of the selected cell and the floating gate electrode.

However, in recent years, the NAND type flash memory of the memory cell is being increasingly miniaturized due to demands of increased memory capacity, which leads to a reduction in the distance between the select gate transistor and an adjacent memory cell.

Here, there is known a phenomenon that, in the cell unit connected to the non-selected bit line, a current based on an interband tunnel flow between a semiconductor substrate (well region) and a diffusion layer of the select gate transistor due to an increase in the channel potential.

The current generates hot electrons.

In the conventional NAND type flash memory, the distance between the select gate transistor and its adjacent memory cell is large. Thus, even though hot electrons are generated, sufficient energy is dissipated before the electrons reach the memory cell, therefore the hot electrons are not injected into the floating gate electrode.

To the contrary, in the NAND type flash memory in recent years, as described above, the distance between the select gate transistor and its adjacent memory cell is reduced, and thus the hot electrons reach the memory cell without loosing much energy.

For this reason, in the case where the selected cell being the object of write is adjacent to the select gate transistor, a wrong write is generated because the electrons are injected into the floating gate of the non-selected cell sharing the selected cell and the word line, in the cell unit connected to the non-selected bit line (refer to, for instance, "A New Programming Disturbance Phenomenon in NAND Flash Memory by Source/Drain Hot Electrons Generated by GIDL Current", NON-VOLATILE SEMICONDUCTOR MEMORY WORKSHOP (NVSMW 2006)).

Incidentally, this problem occurs in a general nonvolatile semiconductor memory having a cell unit comprised a select gate transistor and memory cell, in addition to a NAND type flash memory.

BRIEF SUMMARY OF THE INVENTION

A nonvolatile semiconductor memory according to an aspect of the present invention comprises a NAND string comprised a plurality of memory cells connected serially, two select gate transistors each of which is connected to each end of the NAND string, and a write control circuit which makes a first write condition for the selected cell, used when one of two memory cells adjacent to the two select gate transistors is defined as a selected cell, different from a second write condition for the selected cell, used when a memory cell not adjacent to the two select gate transistors is defined as the selected cell, among the plurality of memory cells.

BRIEF DESCRIPTION OF THE SEVERAL VIEWS OF THE DRAWING

FIG. 1 is a view showing a cell unit of a NAND type flash memory;

FIG. 10 is a flowchart showing a write operation of a second embodiment;

FIG. 20 is a timing chart showing a write operation of the second concrete example;

FIG. 21 is a timing chart showing a write operation of the second concrete example;

FIG. 22 is a timing chart showing a write operation of a third concrete example;

FIG. 23 is a timing chart showing a write operation of the third concrete example;

FIG. 32 is a timing chart showing a write operation of the fifth concrete example;

FIG. 33 is a timing chart showing a write operation of the fifth concrete example;

DETAILED DESCRIPTION OF THE INVENTION

Figure 2:
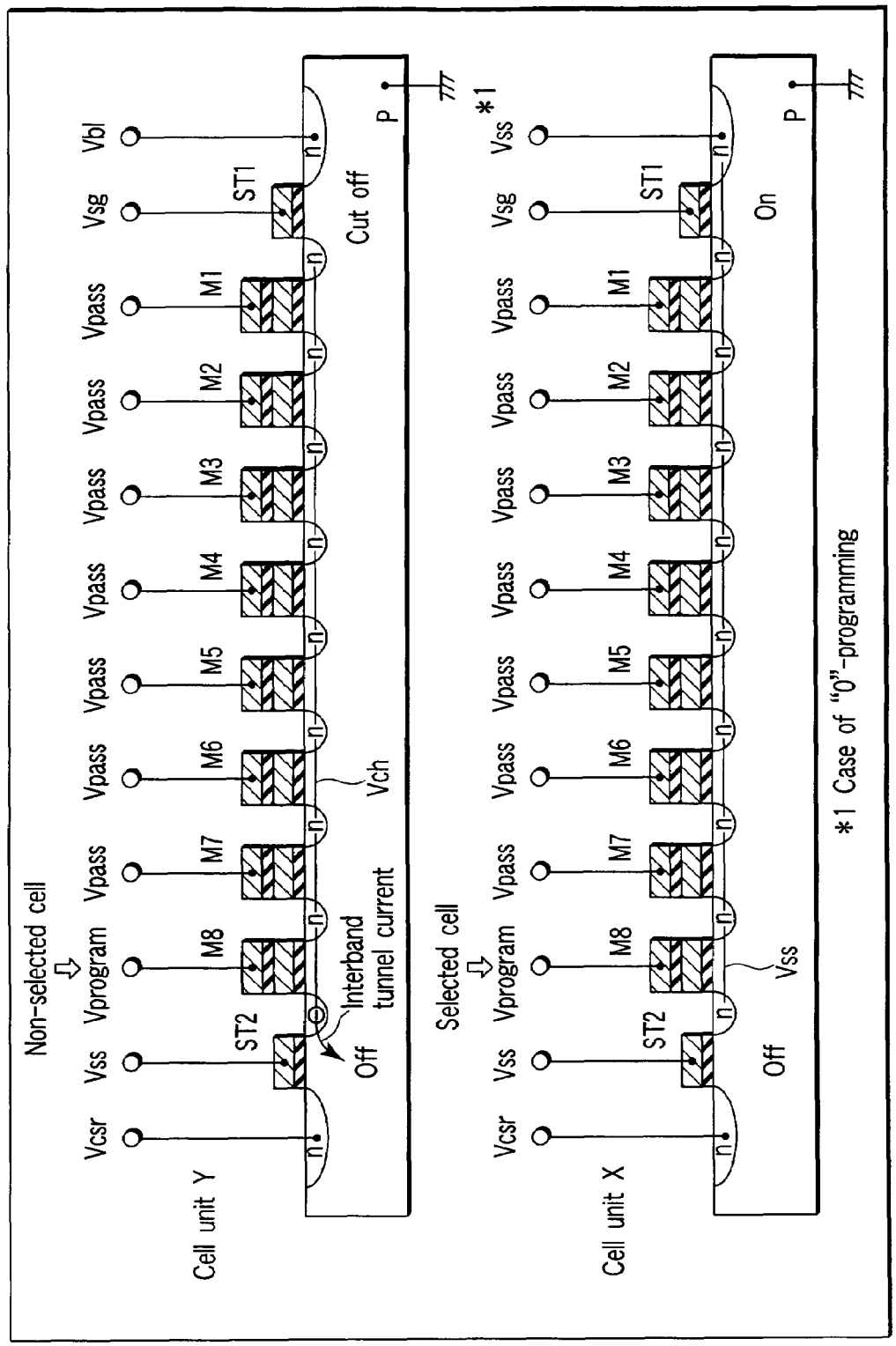
FIG. 2 is a view showing principle of a wrong write caused by a hot electron.

A nonvolatile semiconductor memory of an aspect of the present invention will be described below in detail with reference to the accompanying drawings.

1. Outline

Features of the nonvolatile semiconductor memory according to examples of the present invention lie in points that, in the case where a write is performed for a memory cell adjacent to a select gate transistor, compared with the case where a write is performed for a memory cell not adjacent to a select gate transistor, write conditions are changed such that, for instance, the timing at which the potential of the selected word line begins to increase is made late, the timing when the selected word line reaches the write potential is made late, or the period during which the write potential is applied to the selected word line is made short.

Thus, it is possible to reduce the occurrence of hot electrons caused by the interband tunnel current in the cell unit connected to the non-selected bit line by changing the write conditions in accordance with a position of the memory cell in the cell unit.

Therefore, in the case where a memory cell adjacent to the select gate transistor is defined as the selected cell, it is possible to improve the characteristic of the memory cell while preventing wrong write to the non-selected cell in the cell unit connected to the non-selected bit line.

Here, defined are some terms so as not to cause misunderstanding in describing examples of the present invention as follows:

Firstly, a write is an operation to increase a threshold value of the memory cell. The lowest state of the threshold value is defined as an erase state, and this state corresponds to "1". The write is defined as "0"-programming, and the write state corresponds to "0".

The write potential is defined as the potential by which an FN (Fowler-Nordheim) tunnel current is flown into the selected cell serving as a write object, while the pass potential is defined as a potential by which one piece of program data (ground potential in the case of write) is transferred to the channel of the selected cell while making the non-selected cell ("1" state) not serving as the write object ON.

The examples of the present invention can be realized regardless of bit number (two-level or multi-level) to be stored in the memory cell. The gist of the present invention lies in a point that, at the time of write, the write condition is changed in accordance with the position of the selected cell.

In the case of two-level, as described above, the data is defined as "1" and "0", while the threshold level is defined as the threshold level "1"<the threshold level "0".

In the case of multi-level, the data is defined as "0", "1", . . . "n", while the threshold level is defined as the threshold level "0"<the threshold level "1" . . . <the threshold level "n".

For instance, when referring to four-level, the data "0", "1", "2", and "3" correspond to "11", "10", "01" and "11", and the right hand side of * of "**" is defined as the low order bit and the left hand side of * is defined as the high order bit. In this case, an operation to make the low order bit or the high order bit from "1" to "0" is defined as a write. That is, all the operations to make "11"→"10", "11"→"01", "10"→"00" are write operations.

2. Principle of Wrong Write

Firstly, the principle of the wrong write due to the hot electrons caused by the interband tunnel current will be described with the NAND flash memory as an example.

As shown in FIG. 1, a memory cell array 1 of a NAND type flash memory has cell units X, Y comprised a NAND string comprised a plurality of memory cells M1, M2, . . . M8 connected serially, and two select gate transistors ST1, ST2, each of which is connected to each end of the NAND string.

One end of the cell units X, Y is connected to a source line SL, while the other end is connected to bit lines BLm-2, BLm-1. Control gate electrodes of the memory cells M1, M2, . . . M8 are connected to a word line driver 2A via word lines WL1, WL2, . . . WL8, while select gate electrodes of the select gate transistors ST1, ST2 are connected to a select gate line driver 2B via select gate lines SGS, SGD.

The source line SL is connected to a source potential control circuit 3A, while the bit lines BLm-2, BLm-1 are connected to data circuits 4.

Such program operations of the NAND type flash memory are sequentially performed, one by one, toward the nearest memory cell to the drain from the nearest memory cell to the source for the NAND string (all the memory cells are in the erase state) in the cell units X, Y.

There will next be described the program operation for the nearest memory cell to the source.

For instance, as shown in FIG. 2, a program is performed for the memory cell (selected cell) M8 in the cell unit X. The memory cell M8 is a memory cell adjacent to the select gate transistor ST2.

A control gate electrode (word line WL8 of FIG. 1) of the memory cell M8 is set to the write potential $V_{program}$, while control gate electrodes (word lines WL1, WL2, ... WL7 of FIG. 1) of the other memory cells M1, M2, ... M7 are set to the pass potential $V_{pass}$.

Further, a select gate electrode (select gate line SGD of FIG. 1) of the drain side select gate transistor ST1 is set to $V_{sg}$ (plus potential), while a select gate electrode (select gate line SGS of FIG. 1) of the source side select gate transistor ST2 is set to a ground potential $V_{ss}$.

A source (source line SL of FIG. 1) of the cell units X, Y is set to $V_{csr}$ (plus potential).

A drain of the cell unit X including the selected cell, that is, the selected bit line corresponding to the bit line BLm-1 of FIG. 1 is, when the program data is "0" (write), set to the ground potential $V_{ss}$ corresponding to the program data "0".

Further, a drain of the cell unit Y not including the selected cell, that is, the non-selected bit line corresponding to the bit line BLm-2 of FIG. 1 is set to write inhibit potential Vb1 (plus potential). Both the write inhibit potential Vb1 and a potential $V_{sg}$ of the select gate electrode of the select gate transistor ST1 are set to, for instance, Vdd.

A semiconductor substrate (or well region) is set to the ground potential $V_{ss}$.

At this time, in the cell unit X, the source side select gate transistor ST2 is turned OFF, while all the memory cells M1, M2, M8 and the drain side select gate transistor ST1 are turned ON. Therefore, the ground potential $V_{ss}$ corresponding to the program data "0" reaches the channel of the memory cell M8.

Therefore, a high electric field is applied to a tunnel insulating film of the memory cell M8, so that electrons are injected into the floating gate electrode of the memory cell M8 due to the FN tunneling phenomenon.

On the other hand, in the cell unit Y, at the initial stage, the source side select gate transistor ST2 is turned OFF, while all the memory cells M1, M2, ... M8 and the drain side select gate transistor ST1 are turned ON. Therefore, the channel potential $V_{ch}$ of the NAND string becomes the write inhibit potential Vb1.

In more detail, the value obtained by subtracting threshold voltage $V_{th}$ from a potential $V_{sg}$ of the select gate electrode of the select gate transistor ST1, for instance, $(V_{dd}-V_{th})$ results in the channel potential $V_{ch}$.

After that, for instance, when supplying the write potential $V_{program}$, the channel potential $V_{ch}$ of the NAND string increases, and the channel potential $V_{ch}$ becomes a higher value than the value $(V_{dd}-V_{th})$ obtained by subtracting the threshold voltage $V_{th}$ from the potential $V_{sg}$ of the select gate electrode of the select gate transistor ST1. Therefore, the select gate transistor ST1 is cut off.

Therefore, with the increase of the write potential $V_{program}$, the channel potential $V_{ch}$ of the NAND string increases too, due to capacity coupling. Thus, there is no chance that a high electric field is applied to the tunnel insulating film of the memory cell M8, so that the write due to the FN tunnel current is inhibited.

However, in the cell unit Y, since the channel potential $V_{ch}$ increases, an interband tunnel current flows in a pn junction comprised the semiconductor substrate (well region) and the diffusion layer, particularly, in the pn junction of the source side select gate transistor ST2 where the potential of the select gate electrode results in the ground potential $V_{ss}$.

The hot electrons thus generated by the interband tunnel current reach the channel of the memory cell M8, which is the non-selected cell, before loosing much energy.

Like the memory cell (selected cell) M8 in the cell unit X, the write potential $V_{program}$ is applied to the control gate electrode of the memory cell M8. Therefore, hot electrons are injected into the floating gate electrode of the memory cell M8, resulting in a wrong write.

Next, there will be described a program operation for the memory cell not adjacent to the select gate transistor.

Figure 3:
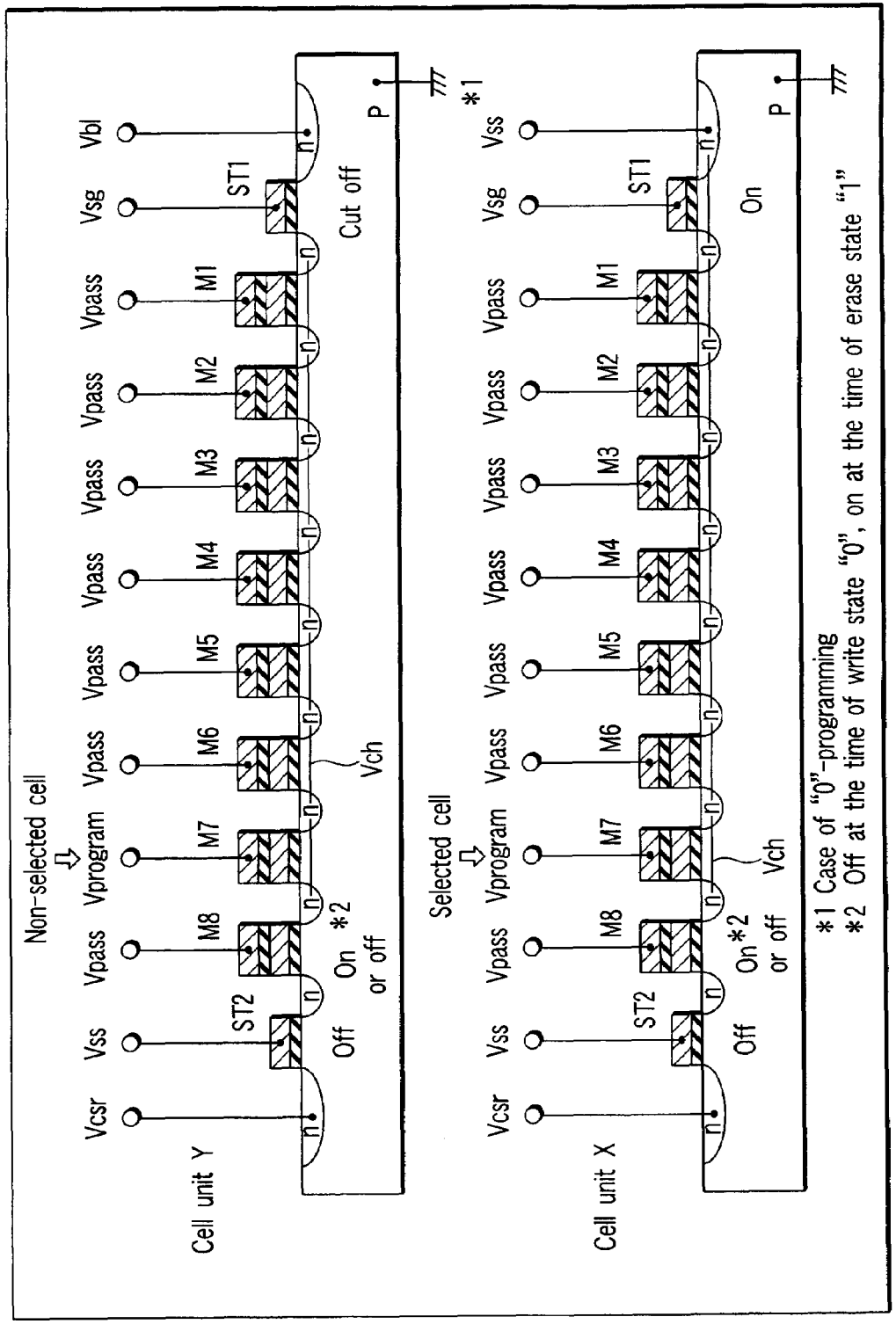
FIG. 3 is a view showing principle of a wrong write caused by a hot electron.

For instance, as shown in FIG. 3, the program operation is performed for the memory cell (selected cell) M7 in the cell unit X. In FIG. 3, compared with FIG. 2, only the position of the selected cell is changed, and the potential relation in the cell units X, Y is basically the same as that of FIG. 2.

In the cell unit X, the source side select gate transistor ST2 is turned OFF, while the memory cells M1, M2, ... M7 and the drain side select gate transistor ST1 are turned ON. Therefore, the ground potential $V_{ss}$ corresponding to the program data "0" reaches the channel of the memory cell M7.

Therefore, a high electric field is applied to a tunnel insulating film of the memory cell M7, so that electrons are injected into the floating gate electrode of the memory cell M7 due to the FN tunneling phenomenon.

On the other hand, in the cell unit Y, at the initial stage, the source side select gate transistor ST2 is turned OFF, while the memory cells M1, M2, ... M7 and the drain side select gate transistor ST1 are turned ON. Therefore, the channel potential $V_{ch}$ of the NAND string becomes, for instance, $(V_{sg}-V_{th})$.

After that, for instance, when supplying the write potential $V_{program}$, the channel potential $V_{ch}$ of the NAND string increases, and the channel potential $V_{ch}$ becomes a higher value than the value $(V_{sg}-V_{th})$. Thus, the select gate transistor ST1 is cut off.

Therefore, with an increase of the write potential $V_{program}$, due to capacity coupling, the channel potential $V_{ch}$ of the NAND string increases too. Thus, there is no chance that a high electric field is applied to the tunnel insulating film of the memory cell M7, so that write due to the FN tunnel current is inhibited.

Further, in the cell unit Y, the interband tunnel current flows at the pn junction of the source side select gate transistor ST2, and thereby hot electrons are generated. Furthermore, like the memory cell (selected cell) M7 in the cell unit X, the write potential $V_{program}$ is applied to the control gate electrode of the memory cell M7.

However, since the distance between the select gate transistor ST2 and the memory cell M7 is sufficient, the hot electrons lose sufficient energy before reaching the memory cell M7. Therefore, there is no chance that a wrong write is generated due to hot electrons being injected into the floating gate electrode of the memory cell M7.

Next, there will be described a program operation for the nearest memory cell to the drain.

Figure 4:
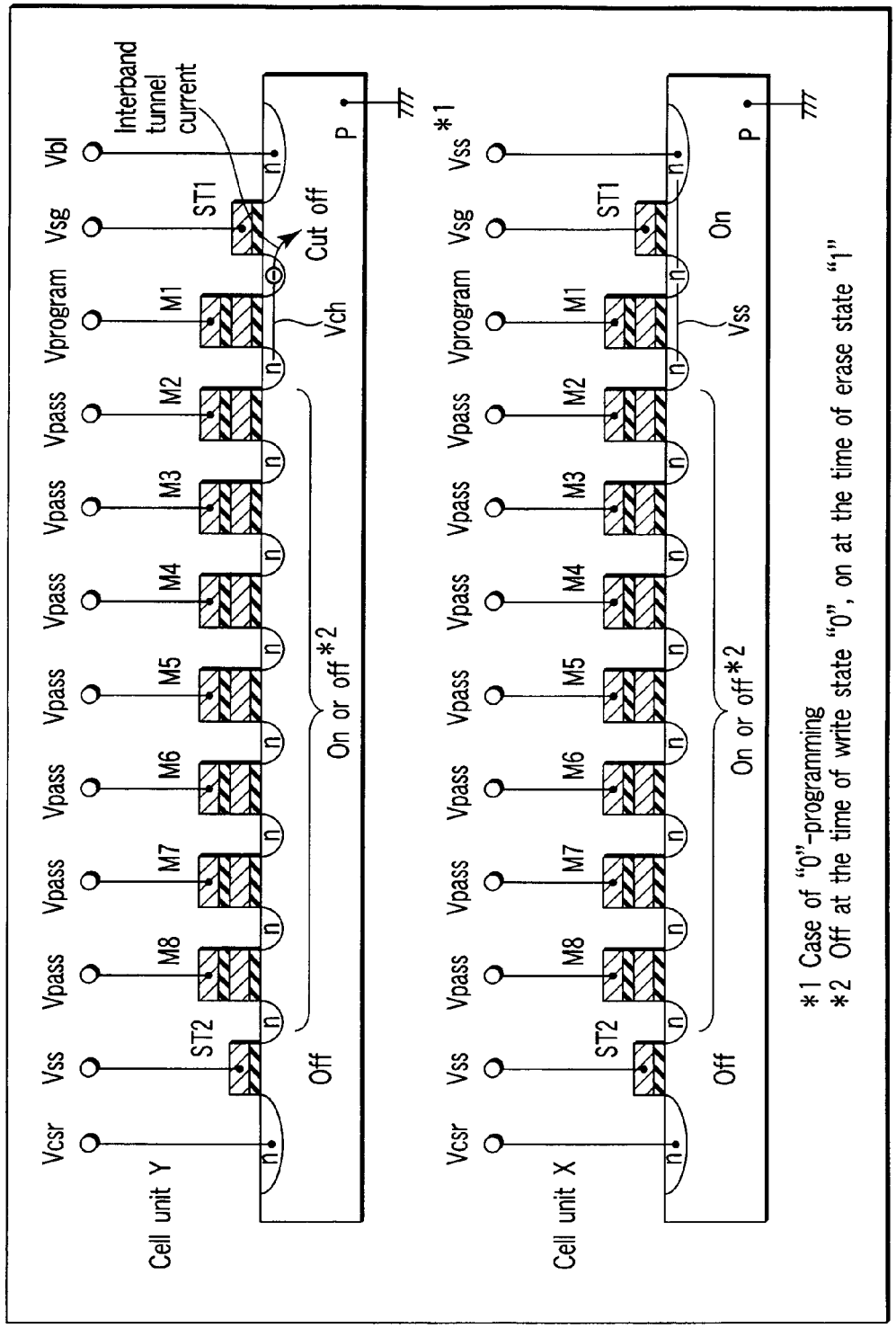
FIG. 4 is a view showing principle of a wrong write caused by a hot electron.

For instance, as shown in FIG. 4, the program operation is performed for the memory cell (selected cell) M1 in the cell unit X. The memory cell M1 is a memory cell adjacent to the select gate transistor ST1. In FIG. 4, compared with FIG. 2, only the position of the selected cell is changed, and the potential relation in the cell units X, Y is basically the same as that of FIG. 2.

In the cell unit X, the source side select gate transistor ST2 is turned OFF, while the memory cell M1 and the drain side select gate transistor ST1 are turned ON. Thus, the ground potential $V_{ss}$ corresponding to the program data "0" reaches the channel of the memory cell M1.

Therefore, a high electric field is applied to a tunnel insulating film of the memory cell M1, so that electrons are injected into the floating gate electrode of the memory cell M1 due to the FN tunneling phenomenon.

On the other hand, in the cell unit Y, at the initial stage, the source side select gate transistor ST2 is turned OFF, while the memory cell M1 and the drain side select gate transistor ST1 are turned ON. Therefore, a channel potential $V_{ch}$ of the NAND string becomes, for instance, $(V_{sg}-V_{th})$.

After that, for instance, when supplying the write potential $V_{program}$, the channel potential $V_{ch}$ of the NAND string increases, and the channel potential $V_{ch}$ becomes higher value than the value $(V_{sg}-V_{th})$. Thus, the select gate transistor ST1 is cut off.

Therefore, with the increase of the write potential $V_{program}$, due to capacity coupling, the channel potential $V_{ch}$ of the NAND string increases too, thus, there is no chance that the high electric field is applied to the tunnel insulating film of the memory cell M1, so that write due to the FN tunnel current is inhibited.

However, in the cell unit Y, since the channel potential $V_{ch}$ increases, the interband tunnel current flows at the pn junction comprised the semiconductor substrate (well region) and the diffusion layer. Here, when the memory cell M8 is defined as the selected cell, the interband tunnel current generated at the source side select gate transistor ST2 becomes the problem, while when the memory cell M1 is defined as the selected cell, the interband tunnel current generated at the drain side select gate transistor ST1 becomes the problem.

The potential $V_{sg}$ of the select gate electrode of the drain side select gate transistor ST1 is higher than the ground potential $V_{ss}$, and compared with the source side select gate transistor ST2, occurrence of the interband tunnel current is relatively suppressed. However, hot electrons are still generated due to the interband tunnel current.

Therefore, such hot electrons reach the channel of the memory cell M1, which is the non-selected cell, before losing much energy.

Like the memory cell (selected cell) M1 in the cell unit X, the write potential $V_{program}$ is applied to the control gate electrode of the memory cell M1. Therefore, hot electrons are injected into the floating gate electrode of the memory cell M1, resulting in the occurrence of a wrong write.

3. Embodiments

Next, there will be described some embodiments regarded as the best.

Hereinafter, there will be described a NAND type flash memory as one kind of nonvolatile semiconductor memory, as an example. In the description, the same numbers are added to the same parts throughout the drawings to clarify the relation between respective drawings.

(1) Overview

Figure 5:
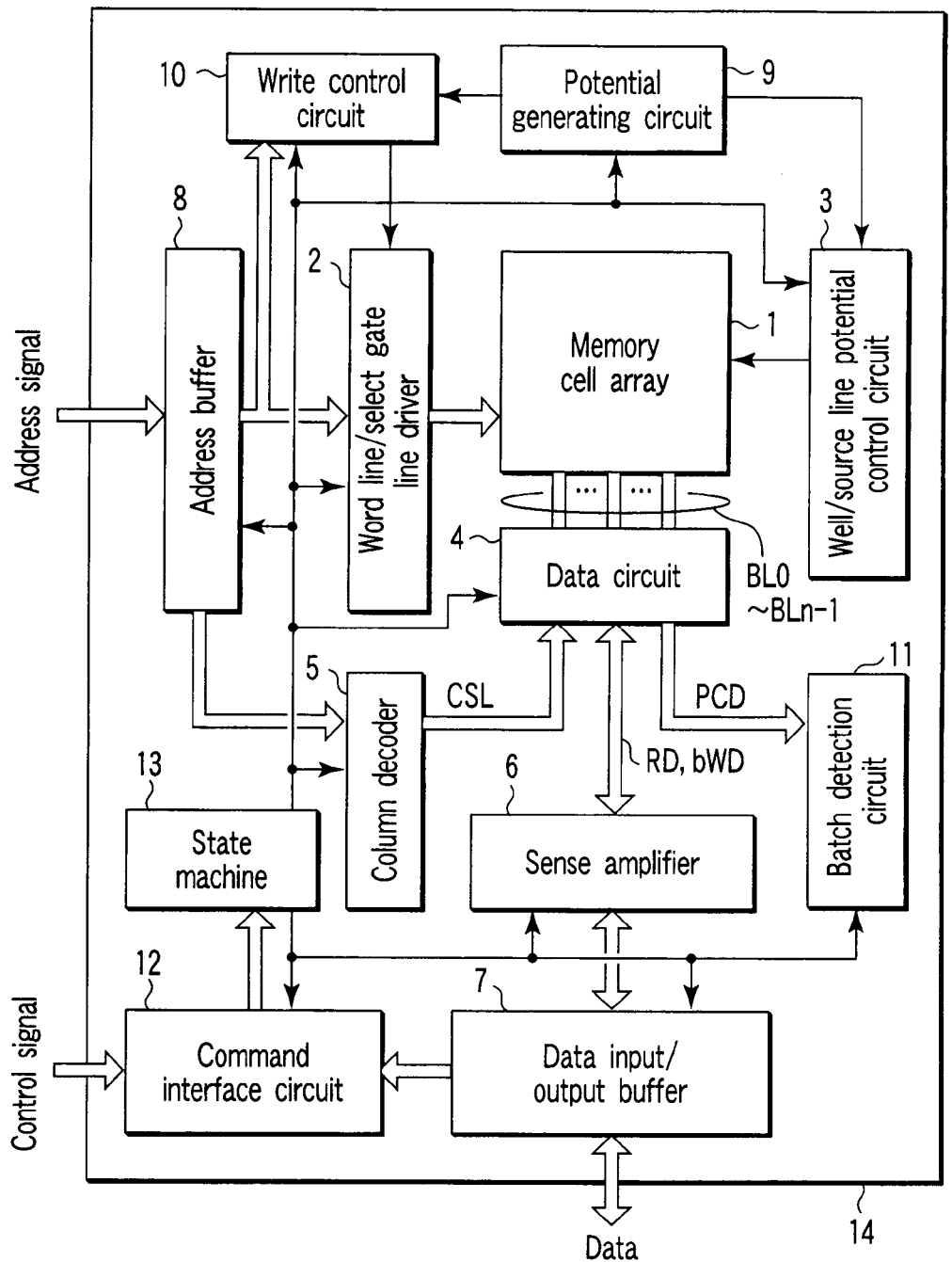
FIG. 5 is a view showing a NAND type flash memory.

FIG. 5 shows a principal part of a NAND cell type flash memory.

A memory cell array 1 has a cell unit comprised a plurality of memory cells connected serially and two select gate transistors each of which is connected to each end of the memory cell.

A word line/select gate line driver 2, including a row decoder, controls potentials of the word line and the select gate line in the memory cell array 1 based on an operation mode and a row address signal.

A well/source line potential control circuit 3 controls a potential of a well region and a potential of a source line in the memory cell array 1 based on an operation mode.

A data circuit 4 has a function to store data temporarily. For instance, at the time of program operation, program data of one page is stored in a latch circuit in the data circuit 4, while at the time of read, read data of one page is stored in the latch circuit in the data circuit 4.

A column decoder 5 selects a column of the memory cell array 1 based on a column address signal.

A sense amplifier 6 senses read data. A data input/output buffer 7 becomes an interface of data input/output, and an address buffer 8 becomes an input buffer of row/column address signal.

A potential generating circuit 9, for instance, at the time of program operation, generates the write potential $V_{program}$ and the pass potential $V_{pass}$. The write potential $V_{program}$ and the pass potential $V_{pass}$ are input to a write control circuit 10.

The write control circuit 10 is a principal part of the example of the present invention, and executes control to change the write condition (timing for applying the write potential $V_{program}$, period during which the write potential $V_{program}$ is applied, or the like) in accordance with a position of the selected cell serving as the write object in the cell unit.

A row address signal determining the position of the selected cell serving as the write object is input to the word line/select gate line driver 2 via the address buffer 8, and also input to the write control circuit 10.

A batch detection circuit 11, at the time of the program operation, verifies whether or not the data is written accurately in the selected memory cell based on a detection signal PCD output from the data circuit 4.

A command interface circuit 12 judges whether or not the data input to the data input/output buffer 7 is command data based on a control signal generated by a chip (for instance, host microcomputer) different from a memory chip 14.

When the data input to the data input/output buffer 7 is command data, the command interface circuit 12 transfers the command data to a state machine 13.

The state machine 13 determines the operation mode of the flash memory based on the command data, and controls the whole operation of the flash memory in accordance with its operation mode.

(2) Memory Cell Array

Figure 6:
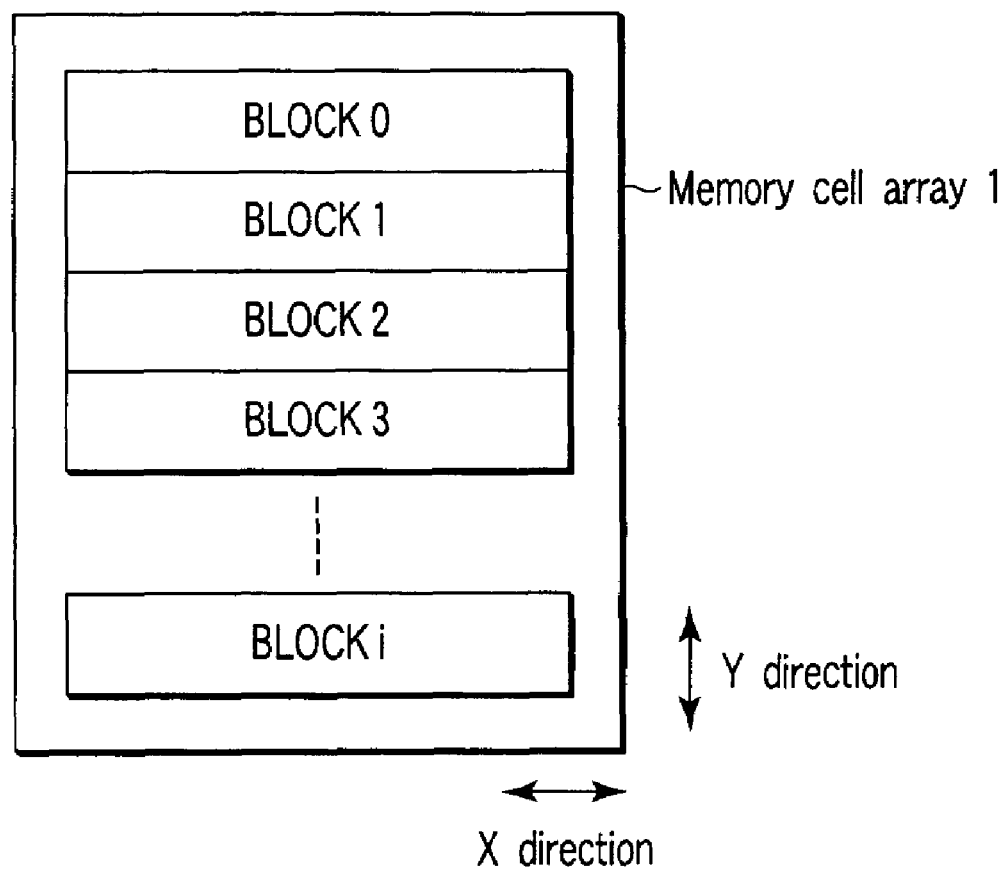
FIG. 6 is a view showing a memory cell array of a NAND type flash memory.
Figure 7:
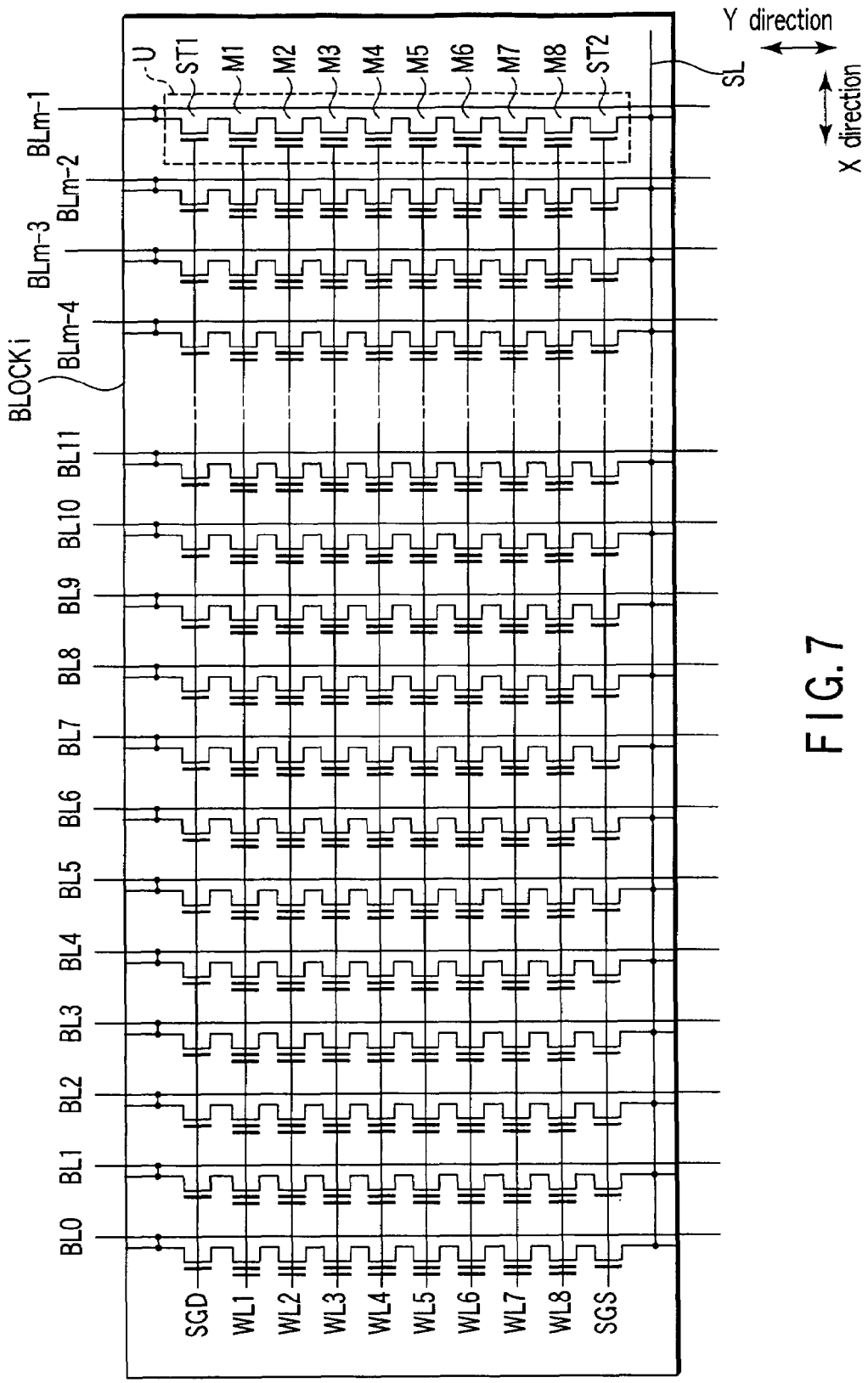
FIG. 7 is a view showing a block of a NAND type flash memory.

FIG. 6 shows an example of the memory cell array. FIG. 7 shows an example of a block in the memory cell array.

A memory cell array 1 is comprised a plurality of blocks BLOCK 0 to BLOCK i (i: the number thereof in the present example). The BLOCK 0 to BLOCK i are arranged side-by-side in the Y direction. One block refers to the minimum unit of a memory cell for erase, that is, the minimum number of memory cells capable of being erased at one time.

The block BLOCK i is comprised a plurality of cell units U (m in the present example) side-by-side in the X direction. The cell unit U is comprised a NAND string comprised eight memory cells M1, M2, . . . M8 connected serially, a select gate transistor ST1 connected to one end of the NAND string, and a select gate transistor ST2 connected to the other end of the NAND string.

In the present example, although the NAND string is comprised 8 memory cells M1, M2, . . . M8, it is preferable that the NAND string may be comprised two or more memory cells, and thus, the NAND string is not particularly limited to 8 memory cells.

The select gate transistor ST1 is connected to bit lines BLq (q=0, 1, ... m−2, m−1), while the select gate transistor ST2 is connected to a source line SL.

Word lines (control gate lines) WL1, WL2, ... WL8 extend in the X direction, and are connected to a plurality of memory cells in the X direction in common. A select gate line SGD extends in the X direction, and is connected to a plurality of select gate transistors ST1 in the X direction in common. Also a select gate line SGS extends in the X direction, and is connected to a plurality of select gate transistors ST2 in the X direction in common.

When one memory cell stores one bit data, one page data is stored in m memory cells positioned at intersections of one word line, for instance, the word line WL1 and bit lines BL0, BL1, ... BLm-2, BLm-1. Further, when one memory cell stores n (n is natural number not less than two) bits of data, n-page data is stored in m memory cells positioned at intersections of the word line WL1 and bit lines BL0, BL1, ... BLm-2, BLm-1.

(3) Cell Array Structure

Figure 8:
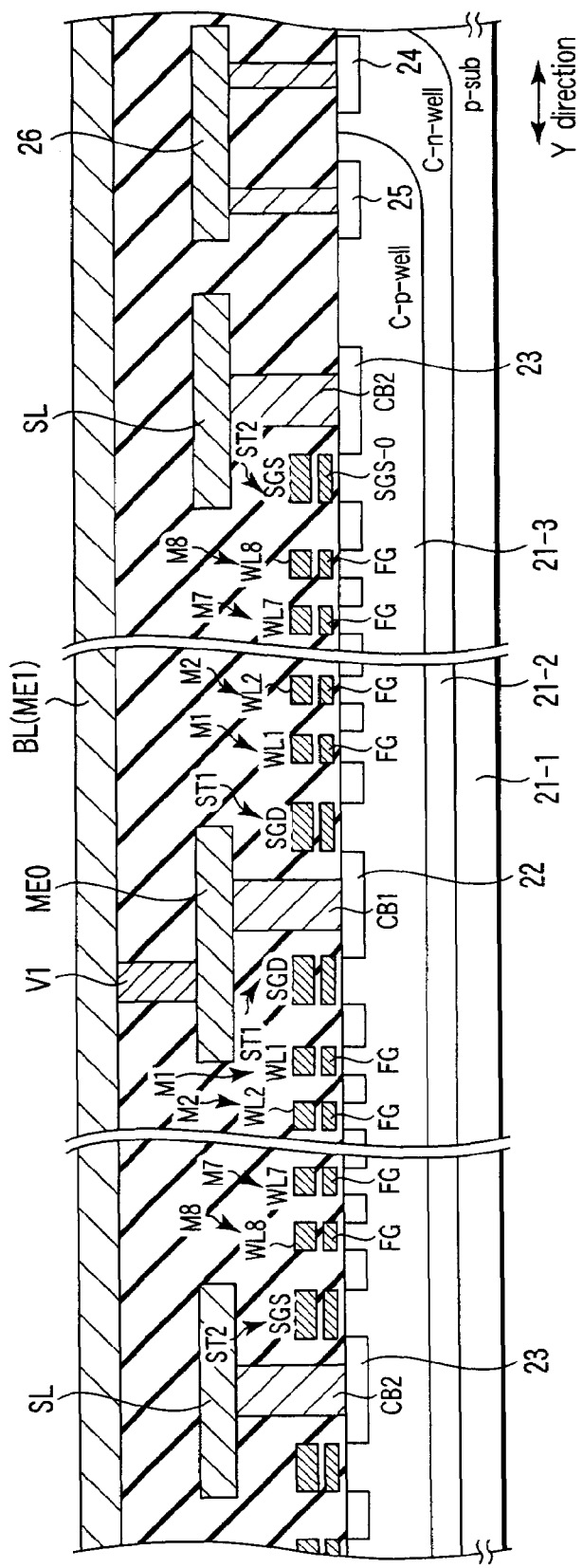
FIG. 8 is a view showing a cell unit of a NAND type flash memory.

FIG. 8 shows an example of cross sectional structure in Y direction of the memory cell array.

A double well region comprised an n-type well region 21-2 and a p-type well region 21-3 is formed in a p-type silicon substrate 21-1.

Eight memory cells M1, M2, ... M8 connected serially are arranged in the p-type well region 21-3. Each of the eight memory cells M1, M2, ... M8 is comprised an N channel MOS transistor, and has a stack gate structure comprised the floating gate electrode FG and the control gate electrodes WL1, WL2, ... WL8.

The select gate transistor ST1 is connected to one end of the NAND string comprised the memory cells M1, M2, ... M8 connected serially, while the select gate transistor ST2 is connected to the other end thereof.

The select gate transistors ST1, ST2 are comprised N channel MOS transistors, and have structure similar to the memory cells M1, M2, ... M8, that is, the select gate lines SGS, SGD of the stack gate structure.

One end of the cell unit, that is, a diffusion layer (drain diffusion layer) 22 of the select gate transistor ST1 is connected to a first metal wiring layer ME0 via a contact plug CB1. Further, the first metal wiring layer ME0 is connected to a second metal wiring layer ME1 as the bit line BL via a via plug V1. The bit line BL is connected to the data circuit.

The other end of the cell unit, that is, a diffusion layer (source diffusion layer) 23 of the select gate transistor ST2 is connected to the first metal wiring layer ME0 as the source line SL via a contact plug CB2. The source line SL is connected to a source line potential control circuit.

An n-type well region (Cell n-well) 21-2 is connected to a potential setting line 26 via an n-type diffusion layer 24, while a p-type well region (Cell p-well) 21-3 is connected to the potential setting line 26 via a p-type diffusion layer 25. That is, the n-type well region 21-2 and the p-type well region 21-3 are set at the same potential. The potential setting line 26 is connected to a well potential control circuit.

Incidentally, the floating gate electrode FG, the control gate electrodes WL1, WL2, ... WL8 and the select gate lines SGS, SGD are made of, for instance, conductive polysilicon including an impurity. Further, the first and second metal wiring layers ME0, ME1 are made of, for instance, aluminum, copper, or an alloy thereof.

(4) Write Operation

Next, there will be described the write operation, which is the principal part of an example of the present invention.

Figure 9:
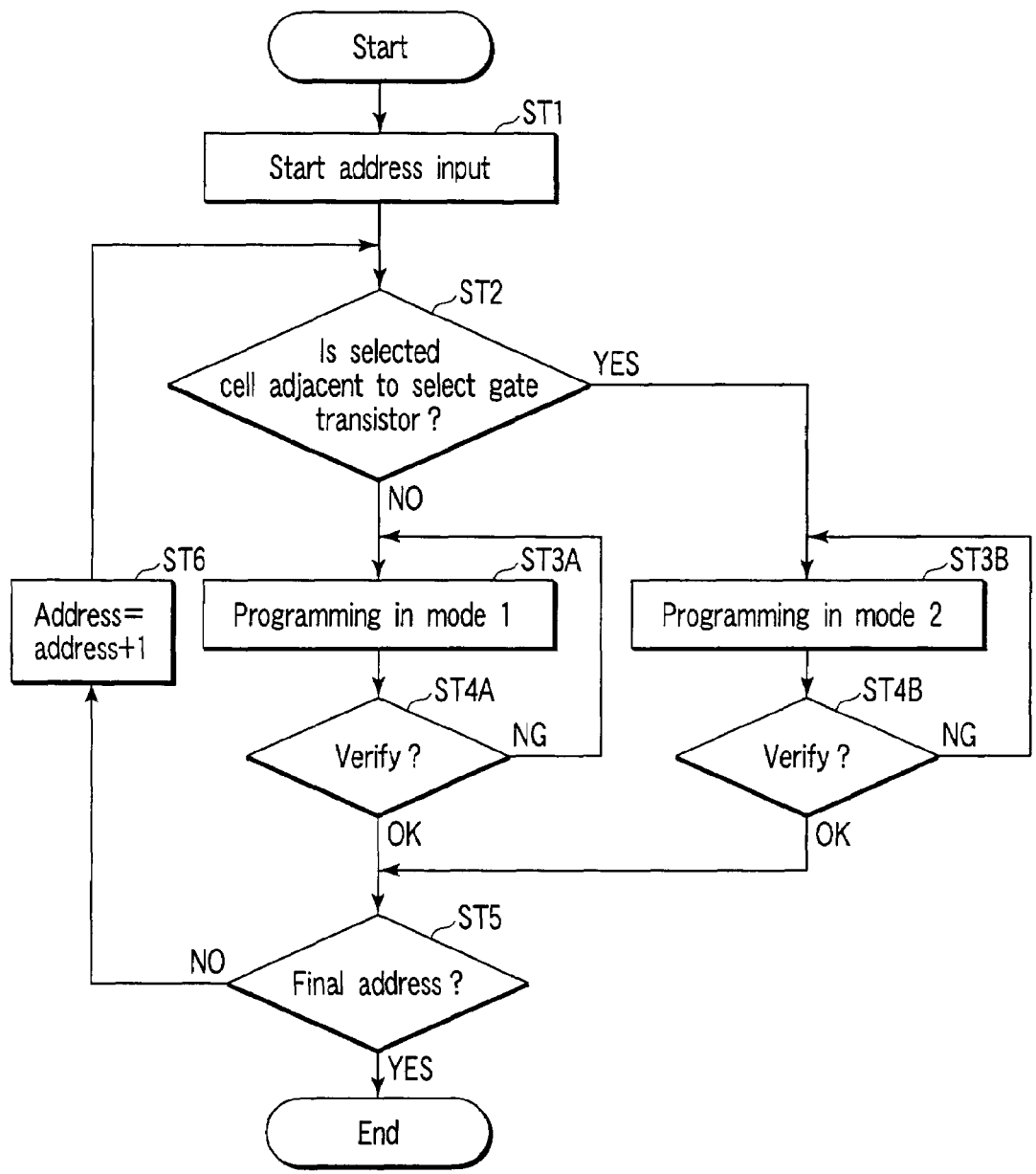
FIG. 9 is a flowchart showing a write operation of a first embodiment.

FIG. 9 shows a flowchart showing the write operation concerned with the first embodiment.

Firstly, a start address is input (step ST1).

Next, it is judged whether or not the selected cell serving as the write (program) object is adjacent to the select gate transistor. When the selected cell is not adjacent to the select gate transistor, programming is executed in mode 1, while when the selected cell is adjacent to the select gate transistor, programming is executed in mode 2 (steps ST2 to ST3A, ST2 to ST3B).

After that, verification is performed (steps ST4A, ST4B).

Further, when reaching the final address, the write operation ends, while when not reaching final address, the write operation is executed again while adding one address (steps ST5 to ST6).

Here, in the step ST2, either one of the following two judgment methods is selected.

It is judged whether or not the memory cell is adjacent to the select gate transistor regardless of source side/drain side.

In this case, for instance, since the memory cells M1, M8 of FIG. 7 are the memory cells adjacent to the select gate transistor, the write condition of the memory cells M1, M8 is made different from the write condition of the other memory cells M2, M3, ... M7.

It is judged whether or not the memory cell is adjacent to the source side select gate transistor.

In this case, for instance, since the memory cell M8 of FIG. 7 is the memory cell adjacent to the select gate transistor, the write condition of the memory cell M8 is made different from the write condition of the other memory cells M1, M2, ... M7.

Although the memory cell M1 is adjacent to the drain side select gate transistor ST1, the write operation is executed in the same write condition as the memory cells M2, M3, ... M7.

Incidentally, details of the modes 1, 2 will be described in concrete examples.

FIG. 10 shows a flowchart showing the write operation concerned with the second embodiment.

Firstly, a start address is input (step ST1).

Next, it is judged whether or not the selected cell serving as the write object is adjacent to the drain side select gate transistor. When the selected cell is adjacent to the drain side select gate transistor, programming is executed in mode 3 (steps ST2 to ST4C).

Further, it is judged whether or not the selected cell serving as the write object is adjacent to the source side select gate transistor. When the selected cell is not adjacent to the source side select gate transistor, programming is executed in mode 1, wile when the selected cell is adjacent to the select gate transistor, programming is executed in mode 2 (steps ST3 to ST4A, ST3 to ST4B).

After that, verification is performed (steps ST5A, ST5B, ST5C).

Further, when reaching the final address, the write operation ends, while when not reaching the final address, the write operation is executed again while adding one address (steps ST6 to ST7).

Features of the second embodiment lie in the point that the write condition of the memory cell adjacent to the source side select gate transistor, and the write condition of the memory cell adjacent to the drain side select gate transistor and the write condition of the memory cell not adjacent to the select gate transistor are made different from one another.

The wrong write caused by hot electrons caused by the interband tunnel current occurs most easily at the memory cell adjacent to the source side select gate transistor, and, the wrong write occurs easily at the memory cell adjacent to the drain side select gate transistor. The wrong write hardly ever occurs at the memory cell not adjacent to the select gate transistor. Thus, the write condition is set to these states.

Incidentally, details of the modes 1, 2 and 3 will be described in concrete examples.

Figure 11:
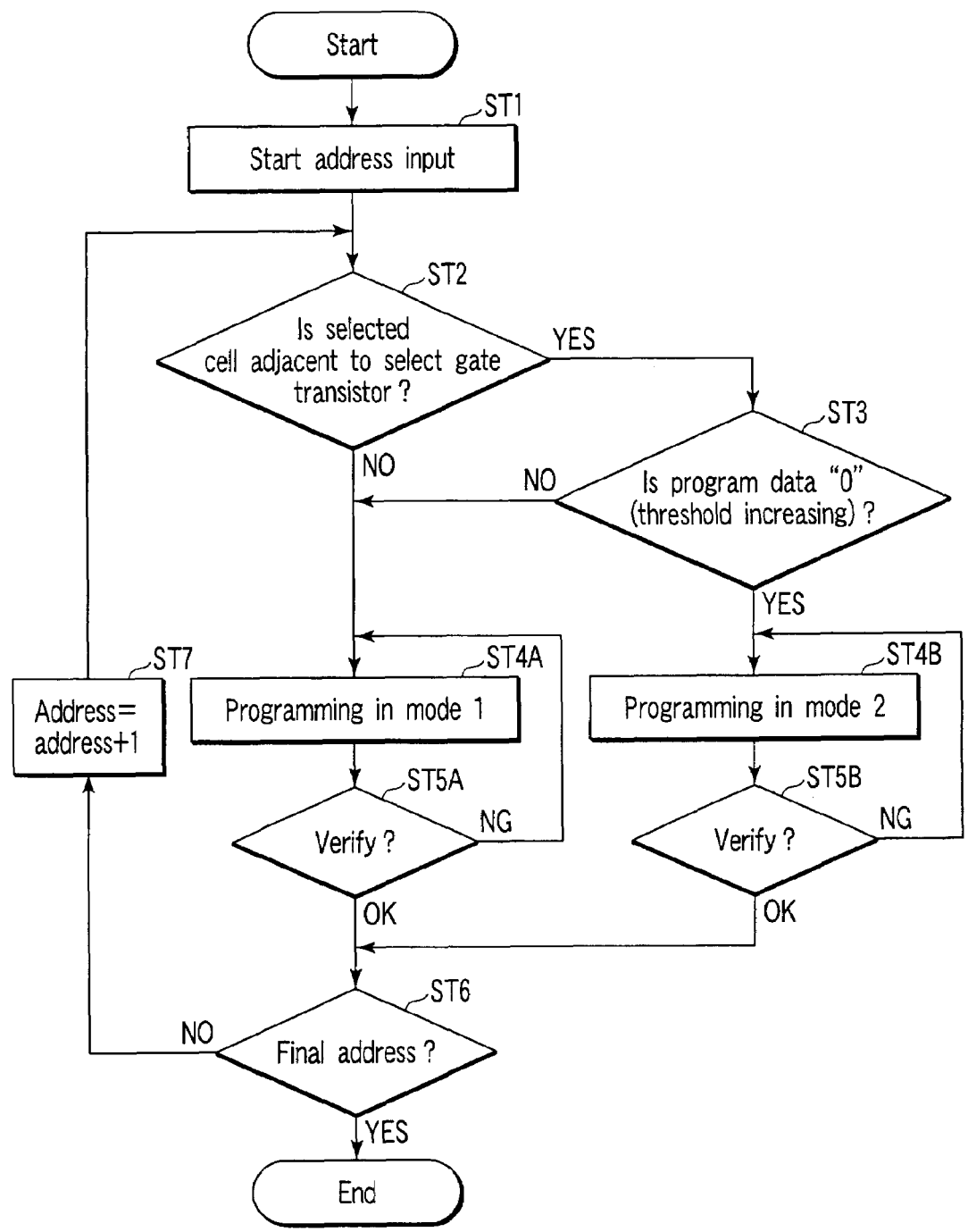
FIG. 11 is a flowchart showing a write operation of the third embodiment.

FIG. 11 shows a flowchart showing the write operation concerned with the third embodiment.

Firstly, a start address is input (step ST1).

Next, it is judged whether or not the selected cell is adjacent to the select gate transistor (step ST2), and it is judged whether or not the program operation to the selected cell is "0"-programming (write) (step ST3).

In the case where the selected cell is not adjacent to the select gate transistor or the program operation to the selected cell is "1"-programming, the programming is executed in mode 1 (steps ST2 to ST3, ST4A).

Further, in the case where the selected cell is adjacent to the select gate transistor and the program operation to the selected cell is "0"-programming, the programming is executed in mode 2 (steps ST2 to ST3, ST4B).

After that, verification is performed (steps ST5A, ST5B).

Further, when reaching the final address, the write operation ends, while when not reaching the final address, the write operation is executed again while adding one address (steps ST6 to ST7).

Here, in the step ST2, like the first embodiment, either one of the following two judgment methods is selected.

It is judged whether or not the memory cell is adjacent to the select gate transistor regardless of the source side/ drain side.

In this case, for instance, since the memory cells M1, M8 of FIG. 7 are the memory cells adjacent to the select gate transistor, when the program data is "0" (write), the write condition of the memory cells M1, M8 is made different from the write condition of the other memory cells M2, M3, ... M7.

It is judged whether or not the memory cell is adjacent to the source side select gate transistor.

In this case, for instance, since the memory cell M8 of FIG. 7 is the memory cell adjacent to the select gate transistor, when the program data is "0" (write), the write condition of the memory cell M8 is made different from the write condition of the other memory cells M1, M2, ... M7.

Although the memory cell M1 is adjacent to the drain side select gate transistor ST1, the write operation is executed in the same write condition as the memory cells M2, M3, ... M7.

Incidentally, details of the modes 1, 2 will be given in concrete examples.

Finally, it is also possible to combine the second embodiment with the third embodiment. In this case, it is preferable that the step ST3 of FIG. 11 is provided between the step ST2 and the step ST4C of FIG. 10, and further between the step ST3 and the step ST4B of FIG. 10.

4. Concrete Examples

There will be described concrete examples in which the modes 1, 2 and 3 in the first to third embodiments are embodied.

(1) First Concrete Example

In the first concrete example, in the case of switching between two modes 1, 2, concerning a period from the time the potential of the word line connected to selected cell or the non-selected cell begins to increase until the time the word line connected to the selected cell is caused to reach the write potential, in the mode 1, there is adopted a first period, while in the mode 2, there is adopted a second period longer than the first period.

Further, in the case of switching among three modes 1, 2 and 3, concerning a period from the time the potential of the word line connected to selected cell or the non-selected cell begins to increase until the time the word line connected to the selected cell is caused to reach the write potential, in the mode 1, there is adopted the first period, in the mode 2, there is adopted the second period longer than the first period, and in the mode 3, there is adopted a third period which is longer than the first period and shorter than the second period.

FIGS. 12 to 16 show timing charts of the first concrete example.

a. The write operation to the memory cell not adjacent to the select gate transistor becomes equivalent to the one shown in a timing chart (mode 1) of FIG. 12.

This timing chart is an example of the case where the word line WL7 is selected.

Firstly, with the condition that a reference potential (ground potential) $V_{ss}$ is applied to the select gate line SGS and all the bit lines BL, a common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL1, ... WL6, WL8. Furthermore, at the time t1', the pass potential $V_{pass}$ is also applied to the selected word line WL7.

Further, at the time t2, the selected word line WL7 is caused to reach the write potential $V_{program}$.

After applying the write potential $V_{program}$ for a fixed period of time to the selected word line WL7, the potential of the selected word line WL7 decreases to the reference potential $V_{ss}$ from the write potential $V_{program}$ at once. After that, the potential of the non-selected word lines WL1, ... WL6, WL8 also decreases to the reference potential $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to this operation timing, since electrons are injected into the floating gate electrode due to the write potential $V_{program}$ for the memory cell (selected cell) between the selected word line WL7 and the selected bit line BL (selected), the write is performed.

On the other hand, since the pass potential $V_{pass}$ is applied to the non-selected word lines WL1, ... WL6, WL8, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

b. The write operation to the memory cell adjacent to the source side select gate transistor becomes equivalent to the one as shown in the timing chart (mode 2) of FIG. 13.

This timing chart is an example of the case where the word line WL8 is selected.

Firstly, with the condition that the reference potential (ground potential) $V_{ss}$ is applied to the select gate line SGS and the whole bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL1, WL2, ... WL7. Furthermore, at the time t1', the pass potential $V_{pass}$ is also applied to the selected word line WL8.

Further, at the time t3 later than the time t2 (the same time as the time t2 of FIG. 12), the selected word line WL8 is caused to reach the write potential $V_{program}$.

After applying the write potential $V_{program}$ to the selected word line WL8 during a fixed period of time, the potential of the selected word line WL8 decreases to the reference potential $V_{ss}$ from the write potential $V_{program}$ at once. After that, the potential of the non-selected word lines WL1, WL2, ... WL7 also decreases to the reference potential $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL8 and the selected bit line BL (selected), the write is performed.

On the other hand, since the pass potential $V_{pass}$ is applied to the non-selected word lines WL1, WL2, ... WL7, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

Here, as described already, about the memory cell adjacent to the source side select gate transistor, at the time of write, there is a possibility of a wrong write taking place due to hot electrons generated by the interband tunnel current.

Figure 12:
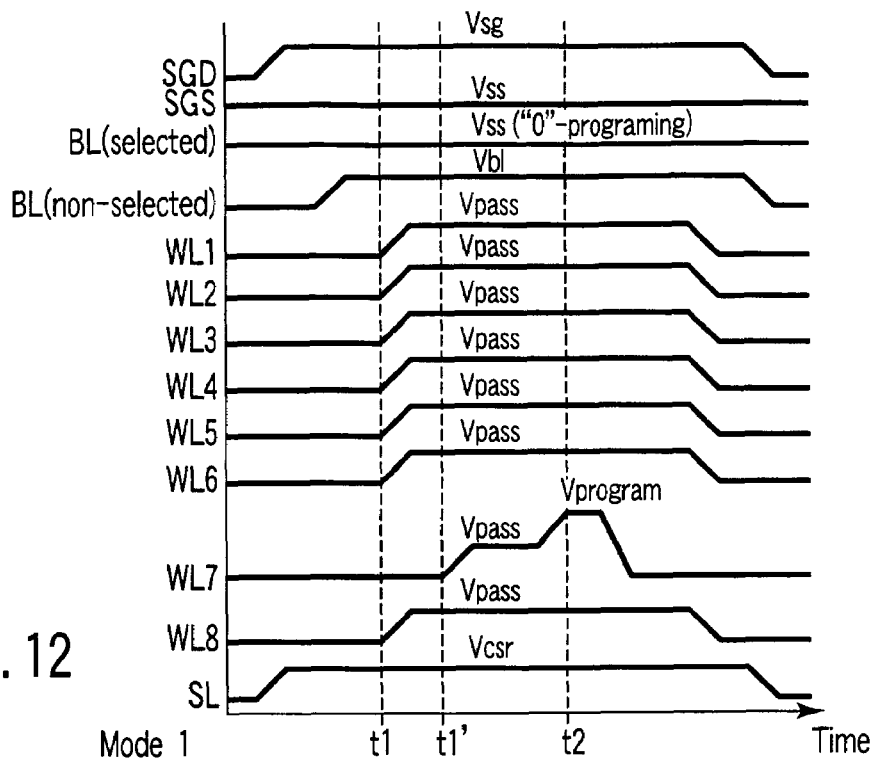
FIG. 12 is a timing chart showing a write operation of a first concrete example.
Figure 13:
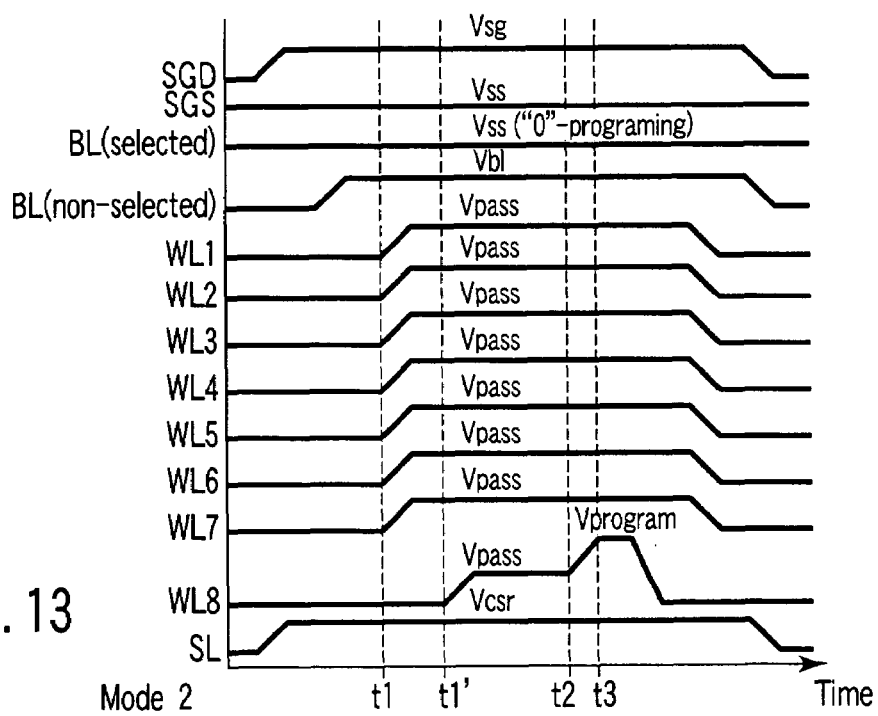
FIG. 13 is a timing chart showing a write operation of the first concrete example.

However, according to the timing chart (mode 2) of FIG. 13, the period (time t1 to time t3) until the time the selected word line WL8 is caused to reach the write potential $V_{program}$ from the time the potential of the non-selected word lines WL1, WL2, ... WL7 begins to increase is longer than the period (time t1 to time t2) until the time the selected word line WL7 is caused to reach the write potential $V_{program}$ from the time the potential of the non-selected word lines WL1, ... WL6, WL8 begins to increase, of the timing chart (mode 1) of FIG. 12.

Accordingly, in the timing chart (mode 2) of FIG. 13, compared with the timing chart (mode 1) of FIG. 12, decreasing amount by a leak current of the channel potential of the NAND string in the cell unit connected to the non-selected bit line BL (non-selected) becomes large. That is, the channel potential at the time t3 is lower than the channel potential at the time t2.

Therefore, the interband tunnel current generated between the diffusion layer of the source side select gate transistor and the semiconductor substrate decreases, so that the number of hot electrons generated by the interband tunnel current also decreases.

Since supply of the write potential $V_{program}$ is started with this condition, at the time of write, it is possible to prevent occurrence of the wrong write due to hot electrons being injected into the floating gate electrode of the memory cell (non-selected cell) adjacent to the source side select gate transistor.

Incidentally, in FIGS. 12 and 13, although the period until the time the selected word line is caused to reach the write potential from the time the potential of the non-selected word line begins to increase is a target, it is possible to obtain the same effect as above, even though the period until the time the selected word line is caused to reach the write potential from the time the potential of the selected word line begins to increase has relationship of (t1' to t2)<(t1' to t3).

Further, as for the potential of the selected word line, in FIGS. 12 and 13, a change of the potential is performed with two steps, such as from the reference potential to the pass potential, and from the pass potential to the write potential. However, a change of the potential may be performed with one step while eliminating the pass potential, and further, it may be performed with three steps or more while adding the step.

Further, in the case where the selected word line is made to be at the write potential with two steps, the potential before supplying the write potential is not limited to the pass potential, and any potential may be adopted as long as the potential is one which exists between the reference potential and the write potential.

c. The write operation to the memory cell adjacent to the drain side select gate transistor becomes equivalent to the one shown in the timing chart (modes 1, 2 and 3) of FIGS. 14 to 16.

These timing charts are examples of the case where the word line WL1 is selected.

Firstly, with the condition that the reference potential (ground potential) $V_{ss}$ is applied to the select gate line SGS and all the bit lines BL, the common source potential $V_{csr}$ is applied to the source line SL and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL2, WL3, ... WL8, and furthermore, at the time t1', the pass potential $V_{pass}$ is also applied to the selected word line WL1.

After that, the write is executed by using one of the modes 1, 2 and 3.

Figure 14:
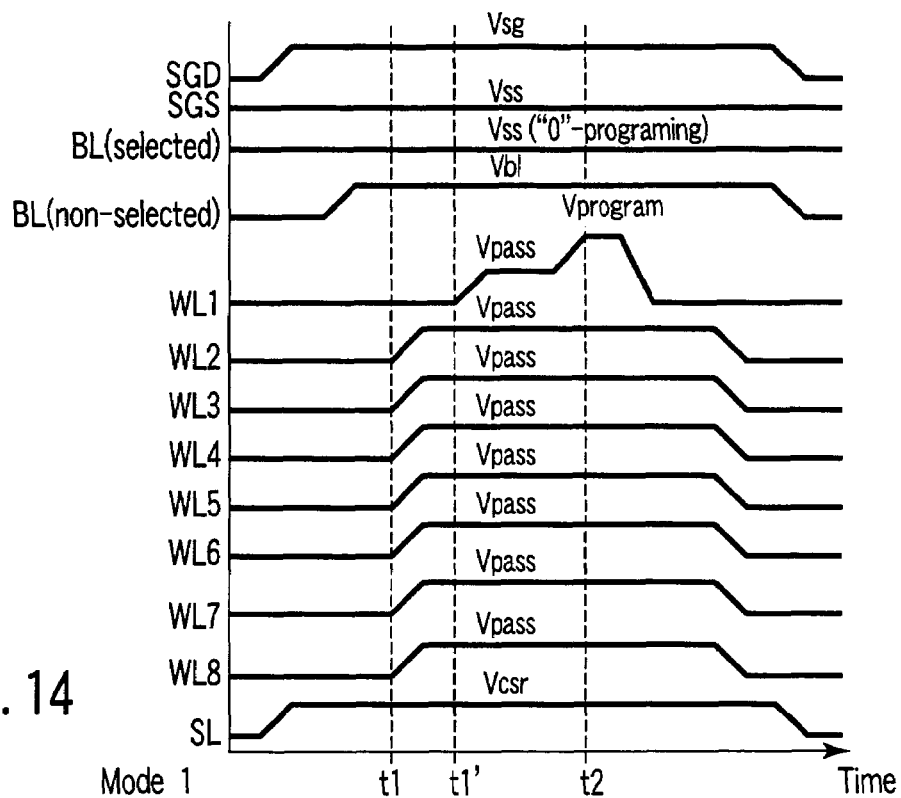
FIG. 14 is a timing chart showing a write operation of the first concrete example.

The first case is one in which, as shown in FIG. 14, like the memory cell not adjacent to the select gate transistor, the write is performed in mode 1. In this case, at the time t2, the selected word line WL1 is caused to reach the write potential $V_{program}$.

Figure 15:
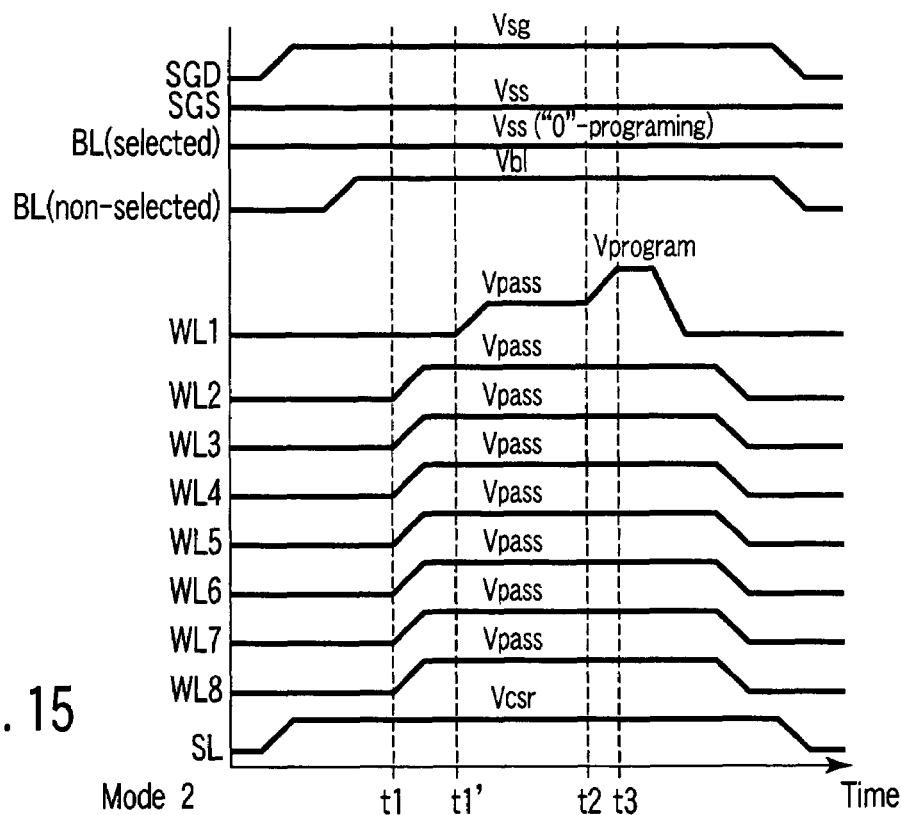
FIG. 15 is a timing chart showing a write operation of the first concrete example.

The second case is one in which, as shown in FIG. 15, like the memory cell adjacent to the source side select gate transistor, the write is performed in mode 2. In this case, at the time t3 later than the time t2, the selected word line WL1 is caused to reach the write potential $V_{program}$.

Figure 16:
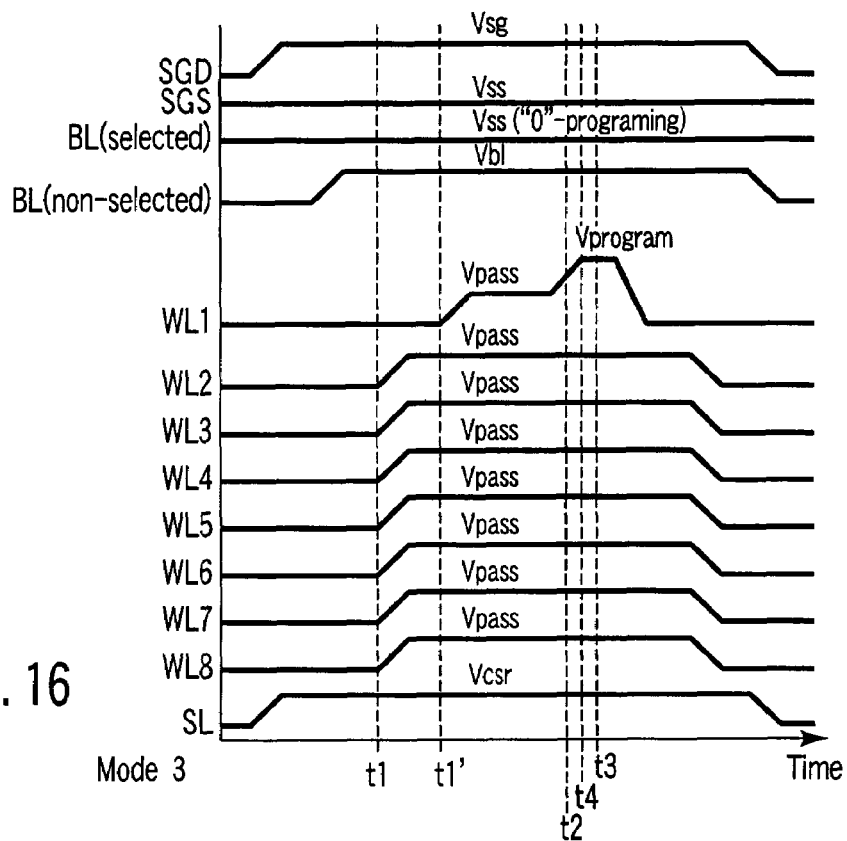
FIG. 16 is a timing chart showing a write operation of the first concrete example.

The third case is one in which, as shown in FIG. 16, the write is performed in mode 3 different from both the mode 1 and the mode 2. In this case, at the time t4 later than the time t2 and earlier than the time t3, the selected word line WL1 is caused to reach the write potential $V_{program}$.

After that, the potential of the selected word line WL1 decreases to the reference potential $V_{ss}$ from the write potential $V_{program}$ at once. Further, the potential of the non-selected word lines WL2, WL3, ... WL8 also decreases to the reference voltage $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

Thus, as for the memory cell adjacent to the drain side select gate transistor, it is possible to select the optimum mode in accordance with the characteristic of the memory cell in each generation of the semiconductor memory.

In the case of selecting the mode 3, it is possible to solve the problem of the wrong write due to the hot electrons generated by the interband tunnel current, and it is possible to achieve compatibility of both high reliability and high speed operation because the write time to the memory cell adjacent to the drain side select gate transistor becomes more or less short.

(2) Second Concrete Example

In the second concrete example, in the case of switching between two modes 1, 2, in mode 1, the potential of the word line connected to the selected cell is caused to increase to the write potential, with the time taken to do so being equivalent to the first period, while, in the mode 2, the word line connected to the selected cell is caused to increase to the write potential, which takes an amount of time equivalent to the second period, which is longer than the first period. Further, as for the time the word line connected to the selected cell is caused to reach the write potential, that in mode 2 is made later than in the mode 1.

In the case of switching among three modes, 1, 2 and 3, in mode 1, the potential of the word line connected to the selected cell is caused to increase to the write potential while taking the first period; in the mode 2, the potential of the word line connected to the selected cell is caused to increase to the write potential while taking the second period, which is longer than the first period; and, in mode 3, the potential of the word line connected to the selected cell is caused to increase to the write potential while taking the third period, which is longer than the first period and shorter than the second period. Further, as for the time taken until the potential of the word line connected to the selected cell reaches the write potential, the time taken in mode 2 is made longer than that in mode 1, and that in mode 3 is made longer than that in mode 1 and shorter than that in mode 2.

FIGS. 17 to 21 show timing charts of the second concrete example.

a. The write operation to the memory cell not adjacent to the select gate transistor becomes equivalent to the one shown in a timing chart (mode 1) of FIG. 17.

This timing chart is an example of the case where the word line WL7 is selected.

Firstly, with the condition that a reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, the pass potential $V_{pass}$ is applied to the non-selected word lines WL1, ... WL6, WL8. After that, the write potential $V_{program}$ is applied to the selected word line WL7.

The potential of the selected word line WL7 increases from the reference potential $V_{ss}$ to the write potential $V_{program}$, from the time t1 to the time t2, and at the time t2, reaches the write potential $V_{program}$.

After supplying the write potential $V_{program}$ to the selected word line WL7 during a fixed time period, the potential of the selected word line WL7 decreases from the write potential $V_{program}$ to the reference potential $V_{ss}$ at once. After that, also the potential of the non-selected word lines WL1, ... WL6, WL8 decreases from the pass potential $V_{pass}$ to the reference potential $V_{ss}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL7 and the selected bit line BL (selected), the write is performed.

On the other hand, since the pass potential $V_{pass}$ is applied to the non-selected word lines WL1, ... WL6, WL8, the write is not performed for the memory cell (non-selected cell) connected thereto.

Further, since the drain side select gate transistor is cut off with respect to the memory cell (non-selected cell) connected to the non-selected bit line BL (non-selected), the write is inhibited because the channel potential increases due to the pass potential $V_{pass}$ and the write potential $V_{program}$.

b. The write operation to the memory cell adjacent to the source side select gate transistor becomes equivalent to the one shown in the timing chart (mode 2) of FIG. 18.

This timing chart is an example of the case where the word line WL8 is selected.

Firstly, with the condition that a reference potential (ground potential) $V_{ss}$ is applied to the select gate line SGS and all the bit lines BL, the is common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, the pass potential $V_{pass}$ is applied to the non-selected word lines WL1, WL2, ... WL7. After that, the write potential $V_{program}$ is applied to the selected word line WL8.

The potential of the selected word line WL8 increases from the reference potential $V_{ss}$ to the write potential $V_{program}$, from the time t1 (the same time as the time t1 of FIG. 17) to the time t3, which is later than the time t2 (the same time as the time t2 of FIG. 17), and at the time t3, the potential of the selected word line WL8 reaches the write potential $V_{program}$.

After supplying the write potential $V_{program}$ to the selected word line WL8 for a fixed time period, the potential of the selected word line WL8 decreases from the write potential $V_{program}$ to the reference potential $V_{ss}$ at once. After that, also the potential of the non-selected word lines WL1, WL2, ... WL7 decreases from the pass potential $V_{pass}$ to the reference potential $V_{ss}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL8 and the selected bit line BL (selected), the write is performed.

On the other hand, since the pass potential $V_{pass}$ is applied to the non-selected word lines WL1, WL2, ... WL7, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

Here, as described already, regarding the memory cell adjacent to the source side select gate transistor, at the time of write, there is a chance that wrong write takes place due to hot electrons generated by the interband tunnel current.

Figure 17:
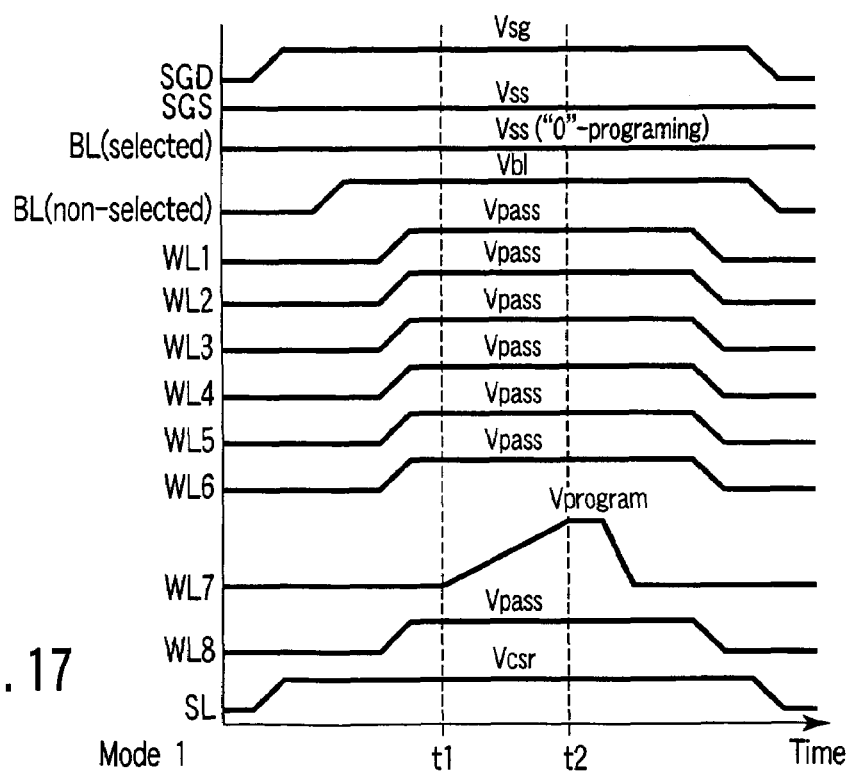
FIG. 17 is a timing chart showing a write operation of a second concrete example.
Figure 18:
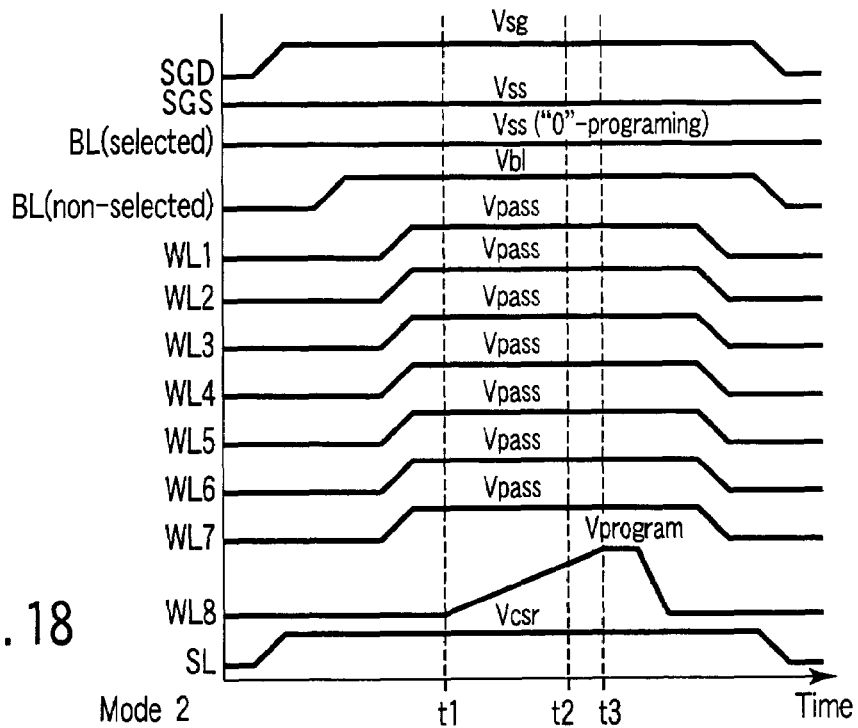
FIG. 18 is a timing chart showing a write operation of the second concrete example.

However, according to the timing chart (mode 2) of FIG. 18, the period (time t1 to time t3) necessary for the potential of the selected word line WL8 to increase to the write potential $V_{program}$ from the reference potential $V_{ss}$ is longer than the period (the time t1 to the time t2) necessary for the potential of the selected word line WL7 to increase to the write potential $V_{program}$ from the reference potential $V_{ss}$ in the timing chart (mode 1) of FIG. 17.

Further, the time t3 at which the write potential $V_{program}$ in the timing chart (mode 2) of FIG. 18 is reached is later than the time t2 at which the write potential $V_{program}$ is reached in the timing chart (mode 1) of FIG. 17.

Accordingly, in the timing chart (mode 2) of FIG. 18, compared with the timing chart (mode 1) of FIG. 17, the channel potential decreasing amount caused by a leak current of the NAND string in the cell unit connected to the non-selected bit line BL (non-selected) becomes large. That is, the channel potential at the time t3 of FIG. 18 is lower than the channel potential at the time t2 of FIG. 17.

Therefore, the interband tunnel current generated between the diffusion layer of the source side select gate transistor and the semiconductor substrate decreases, so that the number of hot electrons generated by the interband tunnel current also decreases.

Since supply of the write potential $V_{program}$ is started with this condition, at the time of write, it is possible to prevent occurrence of the wrong write due to hot electrons being injected into the floating gate electrode of the memory cell (non-selected cell) adjacent to the source side select gate transistor.

c. The write operation for the memory cell adjacent to the drain side select gate transistor becomes equivalent to the one as shown in the timing chart (modes 1, 2 and 3) of FIGS. 19 to 21.

These timing charts are examples of the case where the word line WL1 is selected.

Firstly, with the condition that the reference potential (ground potential) $V_{ss}$ is applied to the select gate line SGS and all the bit lines BL, the common source potential $V_{csr}$ is applied to the source line SL and the select gate potential $V_{sg}$ is applied to the select gate line SGD.

Next, the write inhibit potential Vb1 is applied to the non-selected bit line BL (non-selected). Further, the pass potential $V_{pass}$ is applied to the non-selected word lines WL2, WL3, ... WL8.

After that, the write is executed by using one of the modes 1, 2 and 3.

Figure 19:
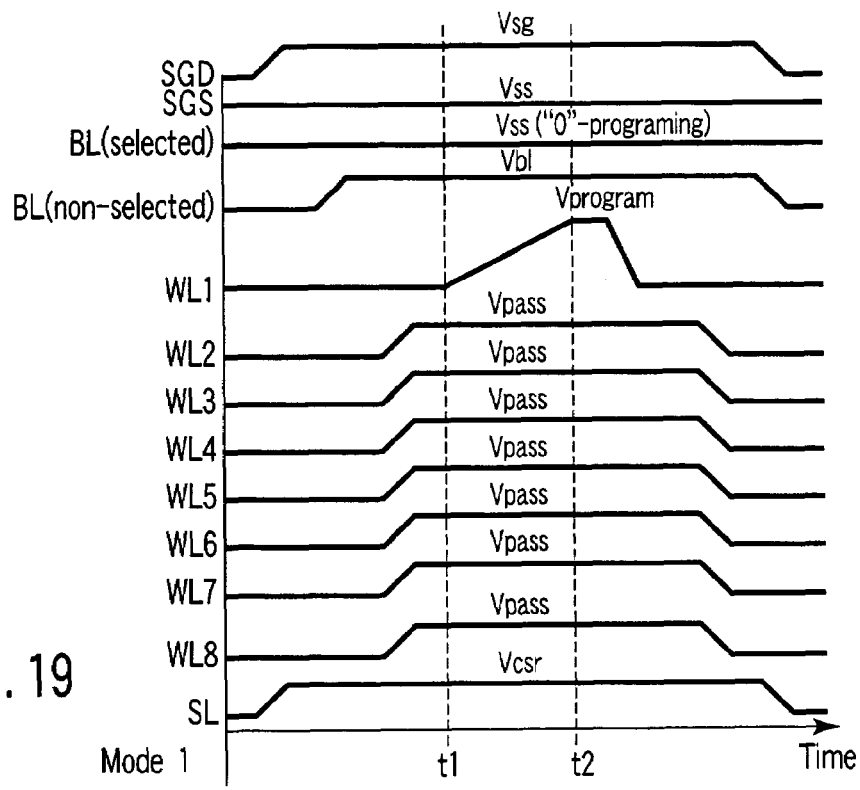
FIG. 19 is a timing chart showing a write operation of the second concrete example.

The first case is one in which, as shown in FIG. 19, like the memory cell not adjacent to the select gate transistor, the write is performed in mode 1. In this case, from the time t1 to the time t2, the potential of the selected word line WL1 increases from the reference potential $V_{ss}$ to the write potential $V_{program}$. The potential of the selected word line WL1 reaches the write potential $V_{program}$ at the time t2.

The second case is one in which, as shown in FIG. 20, like the memory cell adjacent to the source side select gate transistor, the write is performed in mode 2. In this case, from the time t1 to the time t3, which is later than the time t2, the potential of the selected word line WL1 increases from the reference potential $V_{ss}$ to the write potential $V_{program}$. The potential of the selected word line WL1 reaches the write potential $V_{program}$ at the time t3.

The third case is one in which, as shown in FIG. 21, the write is performed in mode 3, which is different from both mode 1 and mode 2. In this case, from the time t1 to the time t4, which is later than the time t2 and earlier than the time t3, the potential of the selected word line WL1 increases from the reference potential $V_{ss}$ to the write potential $V_{program}$. The potential of the selected word line WL1 reaches the write potential $V_{program}$ at the time t4.

After that, the potential of the selected word line WL1 decreases to the reference potential $V_{ss}$ from the write potential $V_{program}$ at once. Further, the potential of the non-selected word lines WL2, WL3, ... WL8 also decreases to the reference voltage $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

Thus, as for the memory cell adjacent to the drain side select gate transistor, it is possible to select the optimum mode in accordance with the characteristic of the memory cell in each generation of the semiconductor memory.

In the case of selecting mode 3, it is possible to solve the problem of the wrong write caused by hot electrons generated by the interband tunnel current, and it is possible to achieve compatibility of both high reliability and high speed operation because the write time to the memory cell adjacent to the drain side select gate transistor becomes more or less short.

d. Incidentally, although the time t1 is the same time in the modes 1, 2 and 3, the time t1 may be different in all modes.

That is, when the time t1 of the mode 1 is defined as t1-1, the time t1 of the mode 2 is defined as t1-2, and the time t1 of the mode 3 is defined as t1-3, if the relationship is (t1-1 to t2)<(t1-3 to t4)<(t1-2 to t3), it is possible to obtain the effect of the present invention.

(3) Third Concrete Example

In the third concrete example, which concerns switching between two modes 1, 2, in the mode 1, the potential of the word line connected to the selected cell is caused to reach the write potential with a plurality of steps, while in the mode 2, the potential of the word line connected to the selected cell is caused to reach the write potential without a plurality of steps.

FIGS. 22 to 25 show timing charts of the third concrete example.

a. The write operation to the memory cell not adjacent to the select gate transistor becomes the same as the one shown in a timing chart (mode 1) of FIG. 22.

This timing chart is an example of the case where the word line WL7 is selected.

Firstly, with the condition that a reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, the pass potential $V_{pass}$ is applied to the non-selected word lines WL1, ... WL6, WL8. Furthermore, at the time t1, the pass potential $V_{pass}$ is also applied to the selected word line WL7.

Further, at the time t2, the potential of the selected word line WL7 is caused to reach the write potential $V_{program}$.

After applying the write potential $V_{program}$ for a fixed period of time to the selected word line WL7, the potential of the selected word line WL7 decreases to the reference potential $V_{ss}$ from the write potential $V_{program}$ at once. After that, the potential of the non-selected word lines WL1, ... WL6, WL8 also decreases to the reference potential $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL7 and the selected bit line BL (selected), the write is performed.

On the other hand, since the pass potential $V_{pass}$ is applied to the non-selected word lines WL1, . . . WL6, WL8, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

b. The write operation to the memory cell adjacent to the source side select gate transistor becomes the same as the one shown in the timing chart (mode 2) of FIG. 23.

This timing chart is an example of the case where the word line WL8 is selected.

Firstly, with the condition that the reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, the pass potential $V_{pass}$ is applied to the non-selected word lines WL1, WL2, . . . WL7. Here, in mode 2, at the time t1, the pass potential $V_{pass}$ is not applied to the selected word line WL8.

Then, at the time t2 (the same time as the time t2 of FIG. 22), the selected word line WL8 is caused to reach the write potential $V_{program}$.

After applying the write potential $V_{program}$ to the selected word line WL8 for a fixed period of time, the potential of the selected word line WL8 decreases to the reference potential $V_{ss}$ from the write potential $V_{program}$ at once. After that, the potential of the non-selected word lines WL1, WL2, . . . WL7 also decreases to the reference potential $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL8 and the selected bit line BL (selected), the write is performed.

On the other hand, since the pass potential $V_{pass}$ is applied to the non-selected word lines WL1, WL2, . . . WL7, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases by the pass potential $V_{pass}$ and the write potential $V_{program}$.

Here, as described already, regarding the memory cell adjacent to the source side select gate transistor, at the time of write, there is a chance that a wrong write will occur due to the hot electrons generated by the interband tunnel current.

However, according to the timing chart (mode 2) of FIG. 23, concerning the selected word line WL8, the pass potential $V_{pass}$ is not supplied to the selected word line WL8, before supplying the write potential $V_{program}$.

For this reason, in the timing chart (mode 2) of FIG. 23, compared with the timing chart (mode 1) of FIG. 22, the channel potential of the NAND string in the cell unit connected to the non-selected bit line BL (non-selected) decreases corresponding to the one in which the pass potential $V_{pass}$ is not supplied to the selected word line WL8. That is, the channel potential at the time t2 of FIG. 23 is lower than the channel potential at the time t2 of FIG. 22.

Therefore, the interband tunnel current generated between the diffusion layer of the source side select gate transistor and the semiconductor substrate decreases, so that also the number of hot electrons generated by the interband tunnel current decreases.

Since supply of the write potential $V_{program}$ begins in this state, at the time of the write, it is possible to prevent the phenomenon of a wrong write occurring due to hot electrons being injected into the floating gate electrode of the memory cell (non-selected cell) adjacent to the source side select gate transistor.

c. The write operation to the memory cell adjacent to the drain side select gate transistor becomes the same as the one shown in the timing chart (modes 1, 2) of FIGS. 24 to 25.

These timing charts are examples of the case where the word line WL1 is selected.

Firstly, with the condition that the reference potential (ground potential) $V_{ss}$ is applied to the select gate line SGS and the whole bit lines BL, the common source potential $V_{csr}$ is applied to the source line SL and the select gate potential $V_{sg}$ is applied to the select gate line SGD.

Next, the write inhibit potential Vb1 is applied to the non-selected bit line BL (non-selected). Further, the pass potential $V_{pass}$ is applied to the non-selected word lines WL2, WL3, . . . WL8.

After that, the write is executed by using one of the modes 1, 2.

Figure 24:
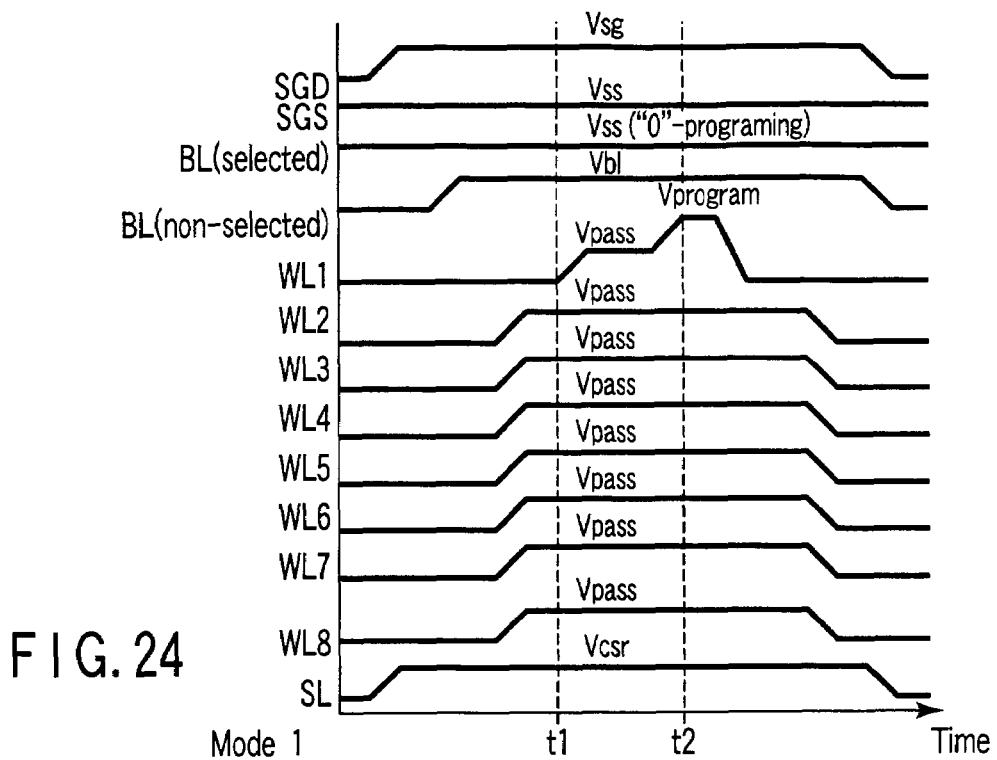
FIG. 24 is a timing chart showing a write operation of the third concrete example.

The first case is one in which, as shown in FIG. 24, like the memory cell not adjacent to the select gate transistor, the write is performed in mode 1. In this case, at the time t1, the pass potential $V_{pass}$ is supplied to the selected word line WL1.

Figure 25:
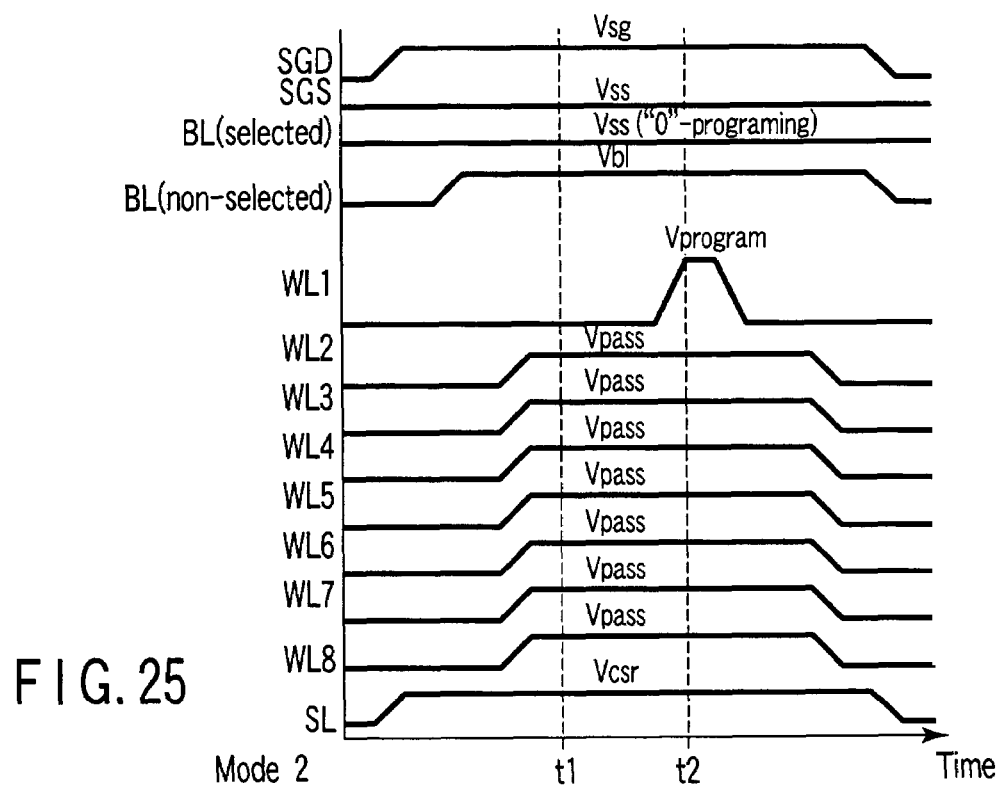
FIG. 25 is a timing chart showing a write operation of the third concrete example.

The second case is one in which, as shown in FIG. 25, like the memory cell adjacent to the source side select gate transistor, the write is performed in mode 2. In this case, at the time t1, the pass potential $V_{pass}$ is not applied to the selected word line WL1, then, at the time t2, the selected word line WL1 is caused to reach the write potential $V_{program}$.

After that, the potential of the selected word line WL1 decreases to the reference potential $V_{ss}$ from the write potential $V_{program}$ at once. Further, the potential of the non-selected word lines WL2, WL3, . . . WL8 also decreases to the reference voltage $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

Thus, as for the memory cell adjacent to the drain side select gate transistor, it is possible to select the optimum mode in accordance with the characteristic of the memory cell in each generation of the semiconductor memory.

d. Incidentally, in the third concrete example, in mode 1, the potential of the word line connected to the selected cell is caused to reach the write potential with two steps. However, it may be caused to reach the write potential with more than three steps. In this case, in the mode 2, the potential of the word line is caused to reach the write potential without a plurality of steps, that is, with one step.

Further, although the time t2 is the same time in modes 1, 2, the time t2 may be different for all modes.

That is, when the time t2 of the mode 1 is defined as t2-1, the time t2 of the mode 2 is defined as t2-2, if the time t2-2 is later than the time t2-1 and the relationship is (t1 to t2-1)<(t1 to t2-2), it fulfils the requirement of the first concrete example simultaneously, and thus it is possible to prevent the wrong write effectively.

(4) Fourth Concrete Example

In the fourth concrete example, in the case of switching between two modes, 1 and 2, concerning a period until the time the word line connected to the selected cell is caused to reach the write potential from the time the potential of the word line connected to the non-selected cell begins to increase, in the case of mode 1, there is adopted the first period, while in the case of mode 2, there is adopted the second period, which is longer than the first period.

Further, in the case of switching among three modes, 1, 2 and 3, concerning a period until the time the word line connected to the selected cell is caused to reach the write potential from the time the potential of the word line connected to the non-selected cell begins to increase, in the case of the mode 1, there is adopted the first period, in the case of mode 2, there is adopted the second period, which is longer than the first period, and in the case of mode 3, there is adopted the third period, which is longer than the first period and shorter than the second period.

FIGS. 26 to 30 show the timing charts of the fourth concrete example.

a. The write operation to the memory cell not adjacent to the select gate transistor becomes the same as the one shown in a timing chart (mode 1) of FIG. 26.

This timing chart is an example of the case where the word line WL7 is selected.

Firstly, with the condition that a reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL1, . . . WL6, WL8.

Further, at the time t2, the potential of the selected word line WL7 begins to increase, and at the time t3, the selected word line WL7 is caused to reach the write potential $V_{program}$.

After applying the write potential $V_{program}$ for a fixed period of time to the selected word line WL7, the potential of the selected word line WL7 decreases to the reference potential $V_{ss}$ from the write potential $V_{program}$ at once. After that, also the potential of the non-selected word lines WL1, . . . WL6, WL8 decreases to the reference potential $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to this operation timing, since electrons are injected into the floating gate electrode by the write potential $V_{program}$ for the memory cell (selected cell) between the selected word line WL7 and the selected bit line BL (selected), the write is performed.

On the other hand, since the pass potential $V_{pass}$ is applied to the non-selected word lines WL1, . . . WL6, WL8, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

b. The write operation to the memory cell adjacent to the source side select gate transistor becomes the same as the one shown in the timing chart (mode 2) of FIG. 27.

This timing chart is an example of the case where the word line WL8 is selected.

Firstly, with the condition that a reference potential (ground potential) $V_{ss}$ is applied to the select gate line SGS and the whole bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL1, WL2, . . . WL7.

Further, at the time t4, which is later than the time t2 (the same time as the time t2 of FIG. 26), the potential of the selected word line WL8 begins to increase, and at the time t5, which is later than the time t3 (the same time as the time t3 of FIG. 26), the potential of the selected word line WL8 is caused to reach the write potential $V_{program}$.

After supplying the write potential $V_{program}$ to the selected word line WL8 for a fixed time period, the potential of the selected word line WL8 decreases from the write potential $V_{program}$ to the reference potential $V_{ss}$ at once. After that, the potential of the non-selected word lines WL1, WL2, . . . WL7 also decreases from the pass potential $V_{pass}$ to the reference potential $V_{ss}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL8 and the selected bit line BL (selected), the write is performed.

On the other hand, since the pass potential $V_{pass}$ is applied to the non-selected word lines WL1, WL2, . . . WL7, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

Here, as described already, about the memory cell adjacent to the source side select gate transistor, at the time of write, there is a chance of wrong write occurring due to hot electrons generated by the interband tunnel current.

Figure 26:
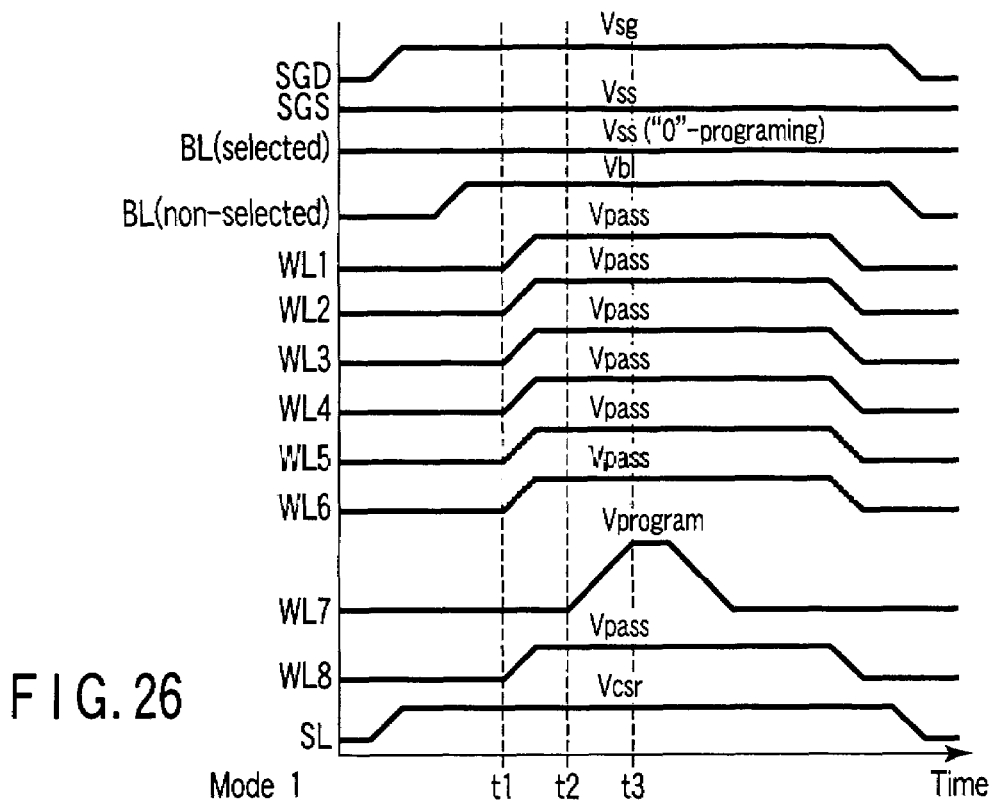
FIG. 26 is a timing chart showing a write operation of a fourth concrete example.
Figure 27:
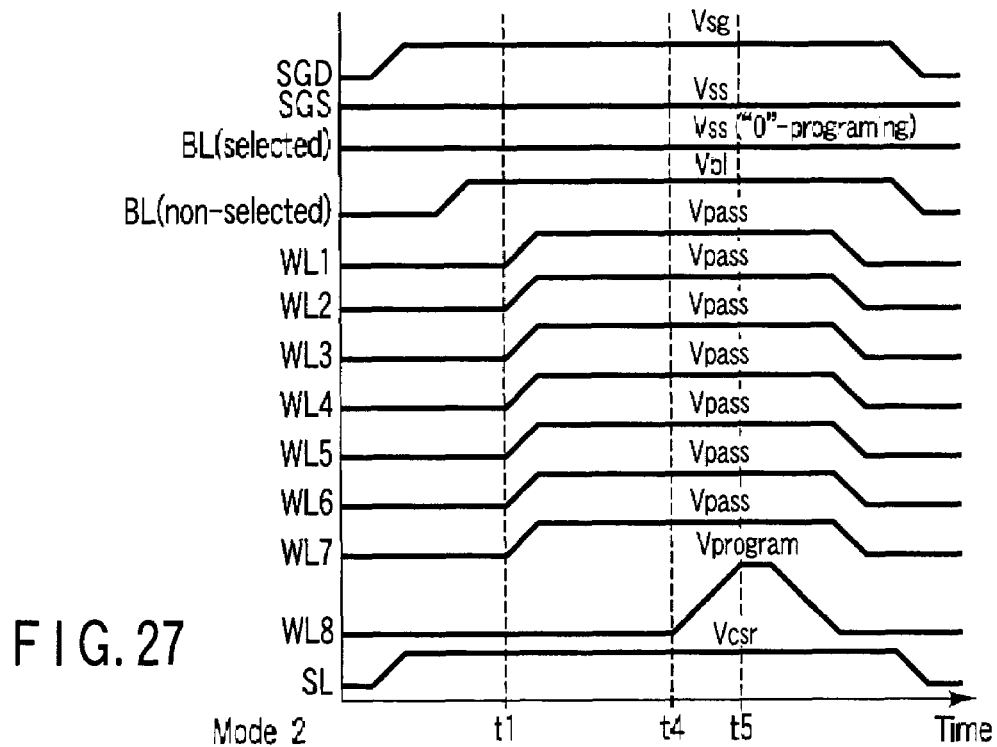
FIG. 27 is a timing chart showing a write operation of the fourth concrete example.

However, according to the timing chart (mode 2) of FIG. 27, the period (time t1 to time t5) necessary for the selected word line WL8 to reach the write potential $V_{program}$ from the time the potential of the word lines WL1, WL2, . . . WL7 begins to increase is longer than the period (the time t1 to the time t3) necessary for the selected word line WL7 to reach the write potential $V_{program}$ from the time the potential of the word lines WL1, . . . WL6, WL8 begins to increase in the timing chart (mode 1) of FIG. 26.

Accordingly, in the timing chart (mode 2) of FIG. 27, compared with the timing chart (mode 1) of FIG. 26, the channel potential decreasing amount caused by a leak current of the NAND string in the cell unit connected to the non-selected bit line BL (non-selected) becomes large. That is, the channel potential at the time t5 is lower than the channel potential at the time t3.

Therefore, the interband tunnel current generated between the diffusion layer of the source side select gate transistor and the semiconductor substrate decreases, so that the number of hot electrons generated by the interband tunnel current also decreases.

Since supply of the write potential $V_{program}$ is started with this condition, at the time of write, it is possible to prevent occurrence of the wrong write caused by hot electrons being injected into the floating gate electrode of the memory cell (non-selected cell) adjacent to the source side select gate transistor.

c. The write operation to the memory cell adjacent to the drain side select gate transistor becomes the same as the one shown in the timing chart (modes 1, 2 and 3) of FIGS. 28 to 30.

These timing charts are examples of the case where the word line WL1 is selected.

Firstly, with the condition that the reference potential (ground potential) $V_{ss}$ is applied to the select gate line SGS and all the bit lines BL, the common source potential $V_{csr}$ is applied to the source line SL and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL2, WL3, . . . WL8.

After that, the write is executed by using one of the modes 1, 2 and 3.

Figure 28:
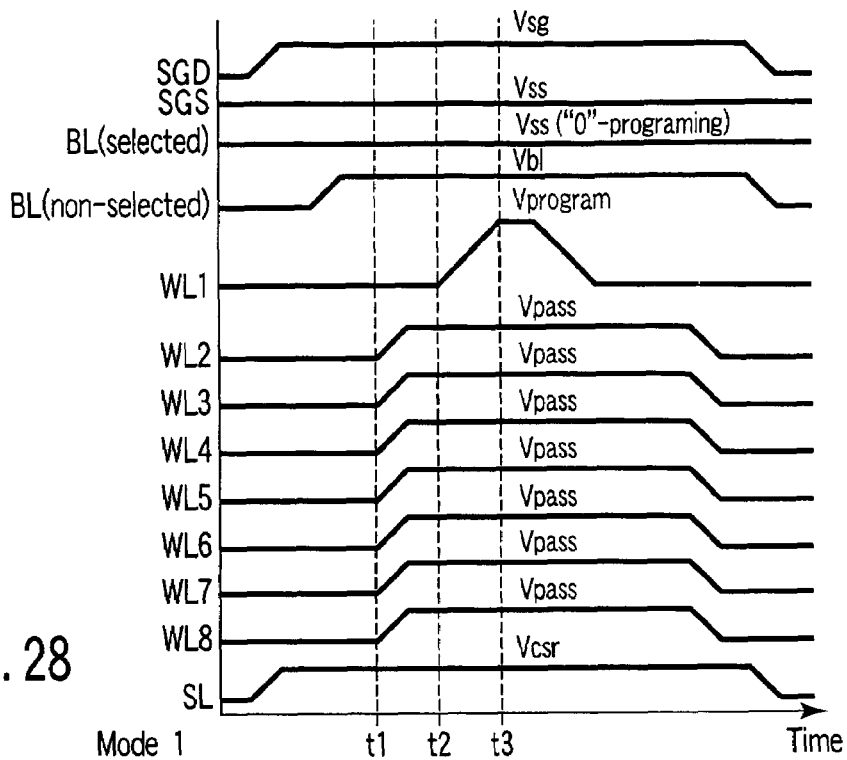
FIG. 28 is a timing chart showing a write operation of the fourth concrete example.

The first case is one in which, as shown in FIG. 28, like the memory cell not adjacent to the select gate transistor, the write is performed in mode 1. In this case, at the time t2, the potential of the selected word line WL1 begins to increase, and at the time t3, the potential of the selected word line WL1 is caused to reach the write potential $V_{program}$.

Figure 29:
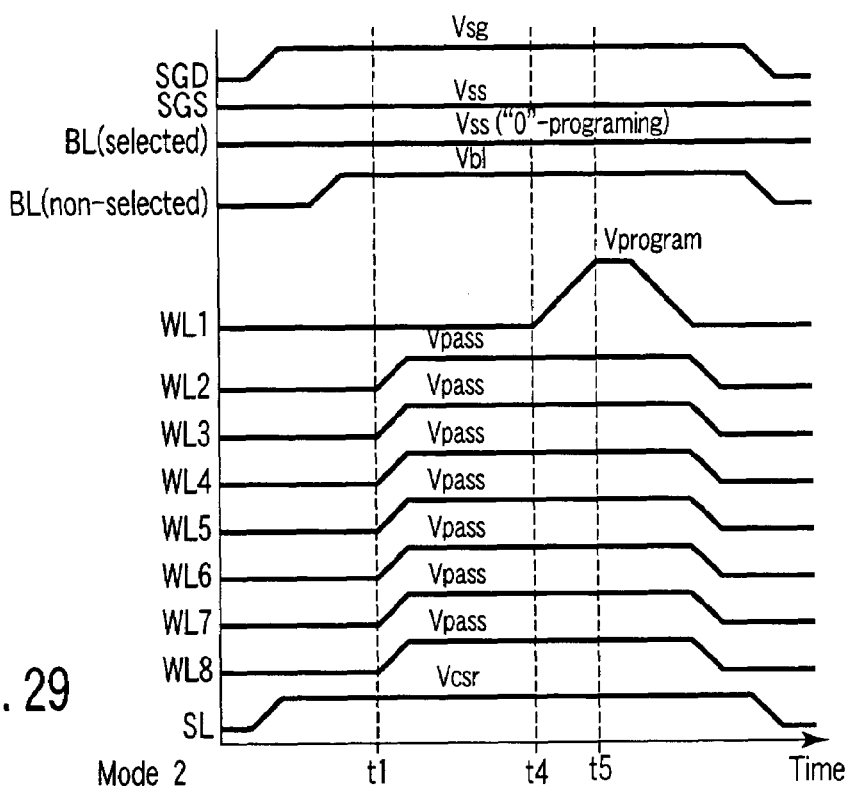
FIG. 29 is a timing chart showing a write operation of the fourth concrete example.

The second case is one in which, as shown in FIG. 29, like the memory cell adjacent to the source side select gate transistor, the write is performed in mode 2. In this case, at the time t4, which is later than the time t2 (the same time as the time t2 of FIG. 28), the potential of the selected word line WL1 begins to increase, and at the time t5, which is later than the time t3 (the same time as the time t3 of FIG. 28), the potential of the selected word line WL1 is caused to reach the write potential $V_{program}$.

Figure 30:
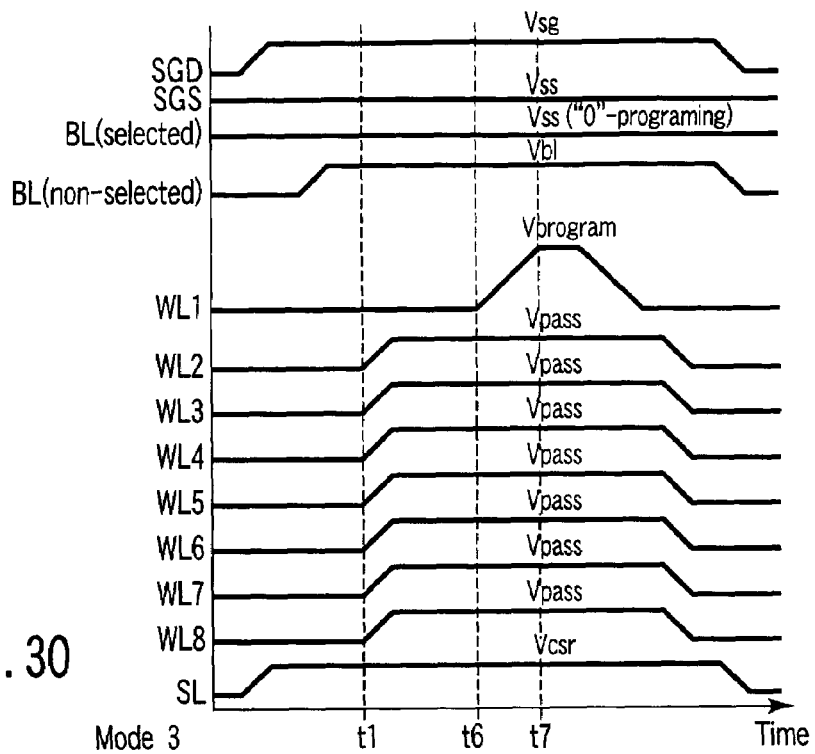
FIG. 30 is a timing chart showing a write operation of the fourth concrete example.

The third case is one in which, as shown in FIG. 30, the write is performed in mode 3, which is different from both mode 1 and mode 2. In this case, at the time t6, which is later than the time t2 (the same time as the time t2 of FIG. 28) and earlier than the time t4 (the same time as the time t4 of FIG. 29), the potential of the selected word line WL1 begins to increase, and at the time t7, which is later than the time t3 (the same time as the time t3 of FIG. 28) and earlier than the time t5 (the same time as the time t5 of FIG. 29), the potential of the selected word line WL1 is caused to reach the write potential $V_{program}$.

After that, the potential of the selected word line WL1 decreases to the reference potential $V_{ss}$ from the write potential $V_{program}$ at once. Further, the potential of the non-selected word lines WL2, WL3, . . . WL8 also decreases to the reference voltage $V_{ss}$ from the pass potential $V_{pass}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

Thus, as for the memory cell adjacent to the drain side select gate transistor, it is possible to select the optimum mode in accordance with the characteristic of the memory cell in each generation of the semiconductor memory.

In the case of selecting mode 3, it is possible to solve the problem of the wrong write caused by hot electrons generated by the interband tunnel current, and it is possible to achieve compatibility of both high reliability and high speed operation because the write time to the memory cell adjacent to the drain side select gate transistor becomes more or less short.

d. Incidentally, in modes 1, 2 and 3, although the waveforms of the write potential $V_{program}$ supplied to the selected word line are the same, the waveforms may be different from one another.

(5) Fifth Concrete Example

In the fifth concrete example, in the case of switching between two modes, 1 and 2, in mode 1, during the first period, the word line connected to the selected cell is made to be at the write potential, while in the mode 2, during the second period shorter than the first period, the word line connected to the selected cell is made to be at the write potential.

Further, in the case of switching among three modes 1, 2 and 3, in the mode 1, during the first period, the word line connected to the selected cell is made to be at the write potential, in the mode 2, during the second period, which is shorter than the first period, the word line connected to the selected cell is made to be at the write potential, and in the mode 3, during the third period, which is shorter than the first period and longer than the second period, the word line connected to the selected cell is made to be at the write potential.

FIGS. 31 to 35 show timing charts of the fifth concrete example.

a. The write operation to the memory cell not adjacent to the select gate transistor becomes the same as the one shown in a timing chart (mode 1) of FIG. 31.

This timing chart is an example of the case where the word line WL7 is selected.

Firstly, with the condition that a reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected), and the pass potential $V_{pass}$ is applied to the non-selected word lines WL1, . . . WL6, WL8. After that, the write potential $V_{program}$ is applied to the selected word line WL7.

The write potential $V_{program}$ is applied continuously to the selected word line WL7 during the period from the time t1 to the time t2.

Further, the potential of the selected word line WL7 decreases from write potential $V_{program}$ to reference potential $V_{ss}$ at once. Also the potential of the non-selected word lines WL1, . . . WL6, WL8 decreases from the pass potential $V_{pass}$ to the reference potential $V_{ss}$.

Finally, the write operation is terminated upon returning the potential of the select gate line SGD to the reference potential $V_{ss}$ from the select gate potential $V_{sg}$ and upon returning the potential of the source line SL to the reference potential $V_{ss}$ from the common source potential $V_{csr}$.

According to such operation timing, since electrons are injected into the floating gate electrode due to the write potential $V_{program}$ for the memory cell (selected cell) between the selected word line WL7 and the selected bit line BL (selected), the write is performed.

On the other hand, since the pass potential $V_{pass}$ is applied to the non-selected word lines WL1, ... WL6, WL8, the write is not performed for the memory cell (non-selected cell) connected thereto.

Further, since the drain side select gate transistor is cut off with respect to the memory cell (non-selected cell) connected to the non-selected bit line BL (non-selected), the write is inhibited because the channel potential increases due to the pass potential $V_{pass}$ and the write potential $V_{program}$.

b. The write operation to the memory cell adjacent to the source side select gate transistor becomes the same as that shown in the timing chart (mode 2) of FIG. 32.

This timing chart is an example of the case where the word line WL8 is selected.

Firstly, with the condition that a reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected), and the pass potential $V_{pass}$ is applied to the non-selected word lines WL1, WL2, ... WL7. After that, the write potential $V_{program}$ is applied to the selected word line WL8.

The write potential $V_{program}$ is supplied continuously to the selected word line WL8 during a period from the time t1 to the time t3, which is earlier than the time t2.

Further, the potential of the selected word line WL8 decreases from write potential $V_{program}$ to reference potential $V_{ss}$ at once. Also the potential of the non-selected word lines WL1, WL2, ... WL7 decreases from the pass potential $V_{pass}$ to the reference potential $V_{ss}$.

Finally, the write operation is terminated upon returning the potential of the select gate line SGD from the select gate potential $V_{sg}$ to the reference potential $V_{ss}$ and upon returning the potential of the source line SL from the common source potential $V_{csr}$ to the reference potential $V_{ss}$.

According to such operation timing, since electrons are injected into the floating gate electrode due to the write potential $V_{program}$ for the memory cell (selected cell) between the selected word line WL8 and the selected bit line BL (selected), the write is performed.

On the other hand, since the pass potential $V_{pass}$ is applied to the non-selected word lines WL1, WL2, ... WL7, the write is not performed for the memory cell (non-selected cell) connected thereto.

Further, since the drain side select gate transistor is cut off from the memory cell (non-selected cell) connected to the non-selected bit line BL (non-selected), the write is inhibited because the channel potential increases due to the pass potential $V_{pass}$ and the write potential $V_{program}$.

Here, as described already, regarding the memory cell adjacent to the source side select gate transistor, at the time of write, there is a chance of a wrong write taking place due to hot electrons generated by the interband tunnel current.

Figure 31:
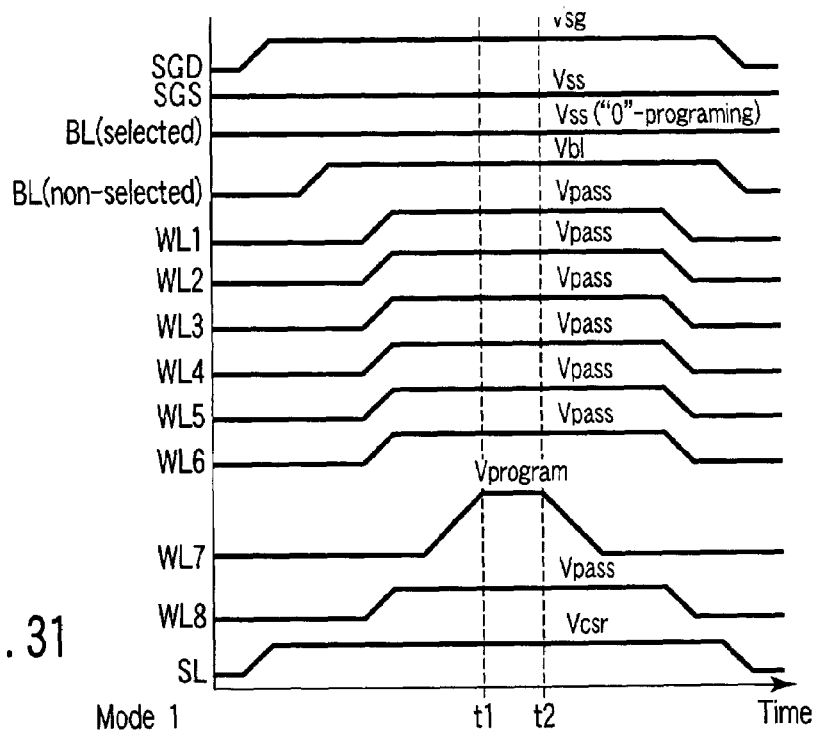
FIG. 31 is a timing chart showing a write operation of a fifth concrete example.

However, according to the timing chart (mode 2) of FIG. 32, the period (time t1 to time t3) during which the write potential $V_{program}$ is applied to the selected word line WL8 is shorter than the period (time t1 to time t2) during which the write potential $V_{program}$ is applied to the selected word line WL7 in the timing chart (mode 1) of FIG. 31.

Accordingly, in the timing chart (mode 2) of FIG. 32, compared with the timing chart (mode 1) of FIG. 31, the period during which the interband tunnel current is generated in the cell unit connected to the non-selected bit line BL (non-selected) becomes shorter, and thus the total number of hot electrons generated by the interband tunnel current decreases.

Therefore, at the time of the write, the amount of hot electrons injected into the floating gate electrode of the memory cell (non-selected cell) adjacent to the source side select gate transistor decreases, thereby preventing occurrence of the wrong write.

c. The write operation to the memory cell adjacent to the drain side select gate transistor becomes the same as the one shown in the timing chart (modes 1, 2 and 3) of FIGS. 33 to 35.

These timing charts are examples of the case where the word line WL1 is selected.

Firstly, with the condition that the reference potential (ground potential) $V_{ss}$ is applied to the select gate line SGS and all the bit lines BL, the common source potential $V_{csr}$ is applied to the source line SL and the select gate potential $V_{sg}$ is applied to the select gate line SGD.

Next, the write inhibit potential Vb1 is applied to the non-selected bit line BL (non-selected), and further, the pass potential $V_{pass}$ is applied to the non-selected word lines WL2, WL3, ... WL8.

After that, the write is executed by using one of the modes 1, 2 and 3.

The first case is one in which, as shown in FIG. 33, like the memory cell not adjacent to the select gate transistor, the write is performed in mode 1. In this case, during the period from the time t1 to the time t2, the write potential $V_{program}$ is applied to the selected word line WL1.

Figure 34:
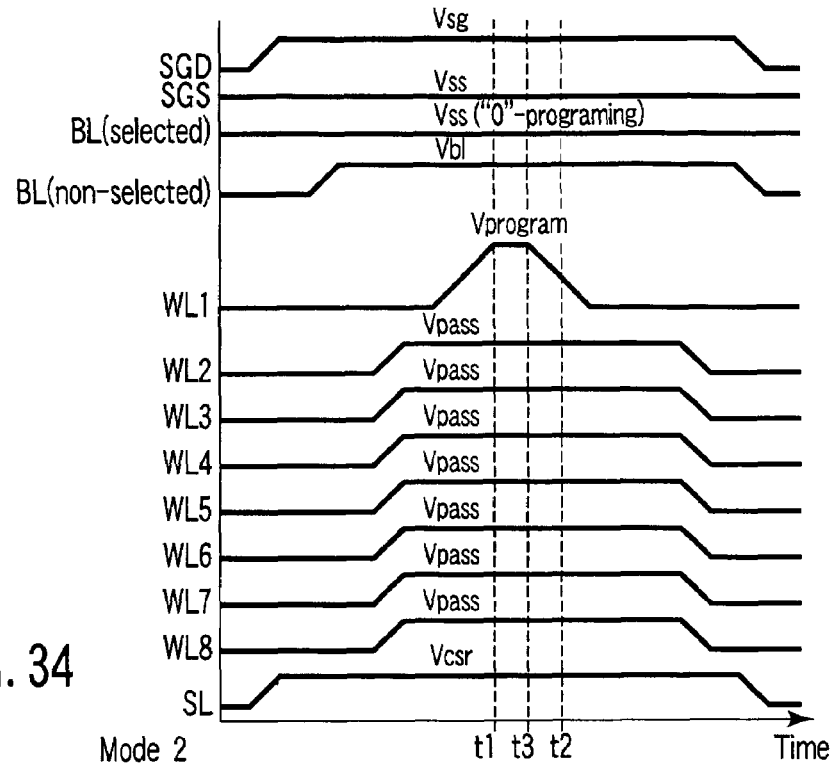
FIG. 34 is a timing chart showing a write operation of the fifth concrete example.

The second case is one in which, as shown in FIG. 34, like the memory cell adjacent to the source side select gate transistor, the write is performed in mode 2. In this case, during the period from the time t1 to the time t3, but earlier than the time t2, the write potential $V_{program}$ is applied to the selected word line WL1.

Figure 35:
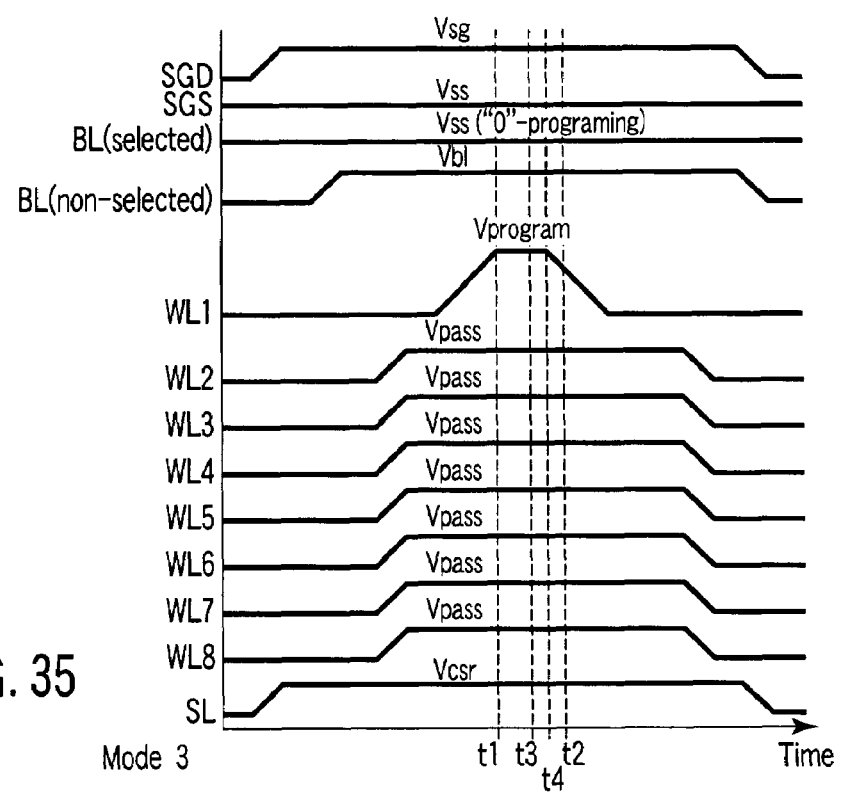
FIG. 35 is a timing chart showing a write operation of the fifth concrete example.

The third case is one in which, as shown in FIG. 35, the write performed in mode 3 is different from that in both mode 1 and mode 2. In this case, during the period from the time t1 to the time t4, but earlier than the time t2 and later than the time t3, the write potential $V_{program}$ is applied to the selected word line WL1.

After that, the potential of the selected word line WL1 decreases from write potential $V_{program}$ to reference potential $V_{ss}$ at once. Further, the potential of the non-selected word lines WL2, WL3, ... WL8 also decreases from the pass potential $V_{pass}$ to the reference voltage $V_{ss}$.

Finally, the write operation is terminated upon returning the potential of the select gate line SGD from the select gate potential $V_{sg}$ to the reference potential $V_{ss}$ and upon returning the potential of the source line SL from the common source potential $V_{csr}$ to the reference potential $V_{ss}$.

Thus, as for the memory cell adjacent to the drain side select gate transistor, it is possible to select the optimum mode in accordance with the characteristic of the memory cell in each generation of the semiconductor memory.

In the case of selecting mode 3, it is possible to solve the problem of the wrong write due to hot electrons generated by the interband tunnel current, and it is possible to achieve compatibility of both high reliability and high speed operation because the write time to the memory cell adjacent to the drain side select gate transistor becomes more or less shorter.

d. Incidentally, although the time t1 is the same in modes 1, 2 and 3, the time t1 may be different for each mode.

That is, when the time t1 of the mode 1 is defined as t1-1, the time t1 of the mode 2 is defined as t1-2, and the time t1 of the mode 3 is defined as t1-3, if the relationship is (t1-1)<(t1-3)≦(t1-2), it is possible to obtain the effect of the present invention.

(6) Sixth Concrete Example

The sixth concrete example is one in which, as in the first to fifth concrete examples, when switching among more than two modes in accordance with the position of the memory cell, the period during which the pass potential is applied continuously is switched corresponding to the above switching mode.

In the sixth concrete example, when one of the two memory cells adjacent to two select gate transistors is defined as the selected cell, during the first period, the word line connected to the non-selected cells other than the selected cell is made to be at the pass potential, while when the memory cell not adjacent to the two select gate transistors is defined as the selected cell, during the second period shorter than the first period, the word line connected to the selected cell is made to be at the pass potential.

FIGS. 36 to 39 show timing charts of the sixth concrete example.

Here, there will be described the case where the sixth concrete example is applied to the fourth concrete example.

a. The write operation for the memory cell not adjacent to the select gate transistor becomes the same as the one shown in a timing chart (mode 1) of FIG. 36.

This timing chart is an example of the case where the word line WL7 is selected.

Firstly, with the condition that a reference potential (ground potential) $V_{ss}$ is applied to the select gate line SGS and the whole bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL1, ... WL6, WL8.

Then, after applying the write potential $V_{program}$ to the selected word line WL7 for a fixed period, the potential of the selected word line WL7 decreases from the write potential $V_{program}$ to the reference potential $V_{ss}$.

After that, at the time t2, the potential of the non-selected word lines WL1, ... WL6, WL8 is made to be at the reference potential $V_{ss}$ from the pass potential $V_{pass}$.

Finally, the write operation is terminated upon returning the potential of the select gate line SGD from the select gate potential $V_{sg}$ to the reference potential $V_{ss}$ and upon returning the potential of the source line SL from the common source potential $V_{csr}$ to the reference potential $V_{ss}$.

According to this operation timing, the period during which the pass potential $V_{pass}$ is applied to the non-selected word lines WL1, ... WL6, WL8 is made to be same as the short period from the time t1 to the time t2, which corresponds to that in mode 1 of the fourth concrete example. For this reason, it becomes possible to perform a high speed write due to the reduction of the write time.

b. The write operation to the memory cell adjacent to the source side select gate transistor becomes one as shown in the timing chart of FIG. 37.

This timing chart is an example of the case where the word line WL8 is selected.

Firstly, with the condition that a reference potential (ground potential) $V_{ss}$ is applied to the select gate line SGS and all the bit lines BL, the common source potential $V_{csr}$ is applied to the source line SL, and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL1, WL2, ... WL7.

Then, after applying the write potential $V_{program}$ to the selected word line WL8 for a fixed period, the potential of the selected word line WL8 is made to be at the reference potential $V_{ss}$ from the write potential $V_{program}$.

Figure 36:
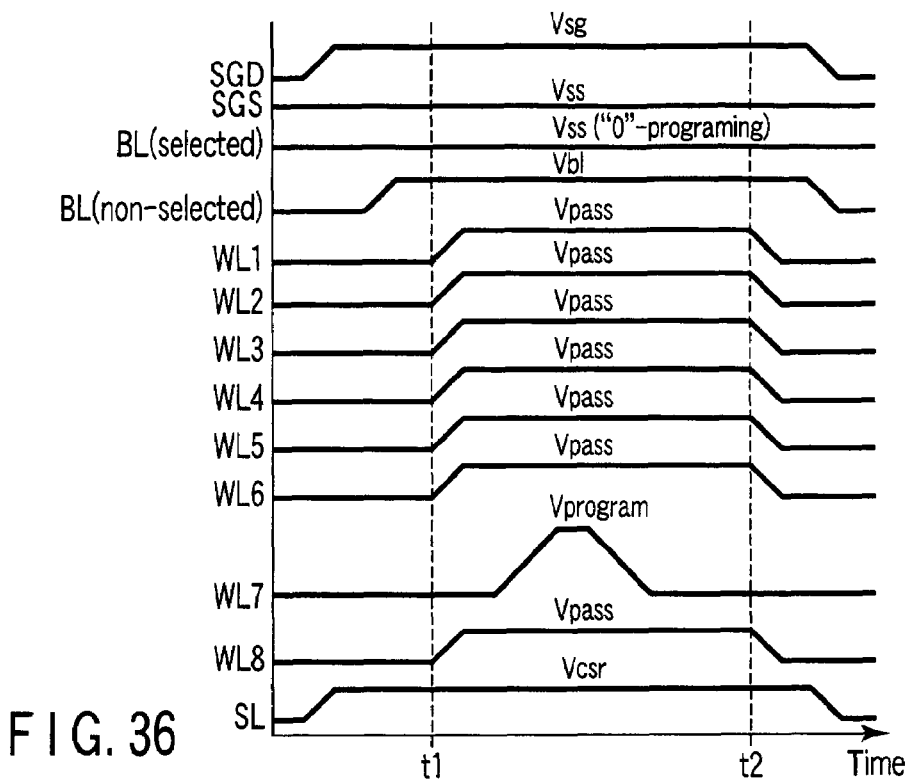
FIG. 36 is a timing chart showing a write operation of a sixth concrete example.
Figure 37:
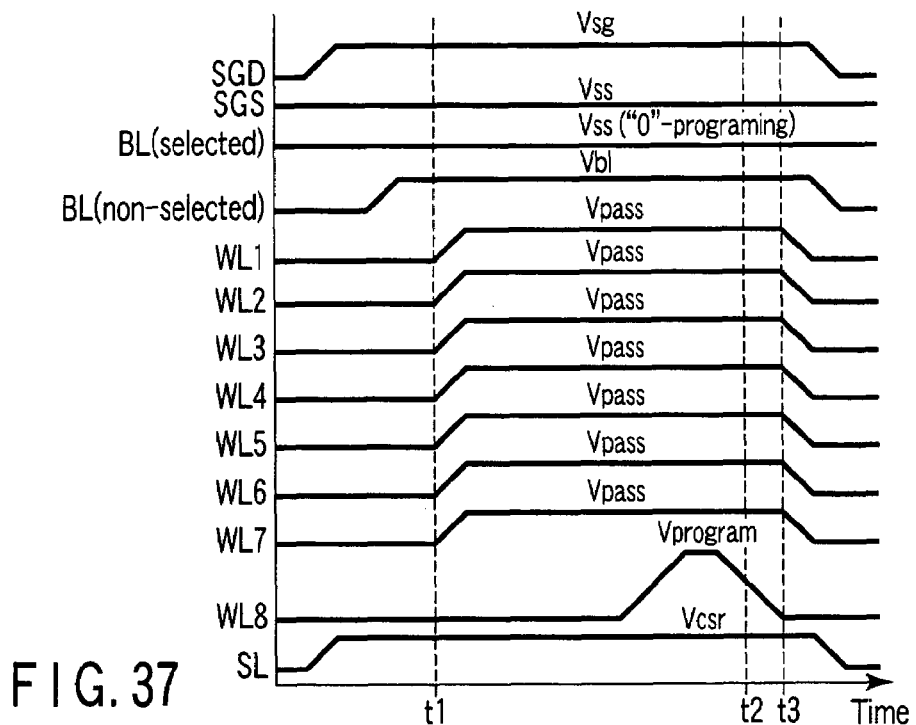
FIG. 37 is a timing chart showing a write operation of the sixth concrete example.

Here, in the timing chart of FIG. 37, compared with the timing chart of FIG. 36, the timing to supply the write potential becomes late.

Accordingly, the potential of the non-selected word lines WL1, WL2, ... WL7 is made to be at the reference potential $V_{ss}$ from the pass potential $V_{pass}$ at the time t3, which is later than the time t2 (the same time as the time t2 of FIG. 36).

Finally, the write operation is terminated upon returning the potential of the select gate line SGD from the select gate potential $V_{sg}$ to the reference potential $V_{ss}$ and upon returning the potential of the source line SL from the common source potential $V_{csr}$ to the reference potential $V_{ss}$.

According to such operation timing, since the period during which the pass potential $V_{pass}$ is applied to the non-selected word lines WL1, WL2, ... WL7 is made a long period from the time t1 to the time t3, corresponding to mode 2 of the fourth concrete example, it is possible to prevent the wrong write caused by hot electrons generated by the inter-band tunnel current without adversely affecting the write operation.

c. The write operation to the memory cell adjacent to the drain side select gate transistor becomes the same as the one shown in the timing chart of FIGS. 38 to 39.

These timing charts are examples of the case where the word line WL1 is selected.

Firstly, with the condition that the reference potential (ground potential) $V_{ss}$ is applied to the select gate line SGS and the whole bit lines BL, the common source potential $V_{csr}$ is applied to the source line SL and the select gate potential $V_{sg}$ is applied to the select gate line SGD.

Next, the write inhibit potential Vb1 is applied to the non-selected bit line BL (non-selected). Further, at the time t1, the pass potential $V_{pass}$ is applied to the non-selected word lines WL2, WL3, ... WL8. After that, the write potential $V_{program}$ is applied to the selected word line WL1.

After that, determined is the period during which the pass potential $V_{pass}$ is applied continuously to the non-selected word lines WL2, WL3, ... WL8 in accordance with the write condition (modes 1, 2) for the memory cell adjacent to the drain side select gate transistor.

Figure 38:
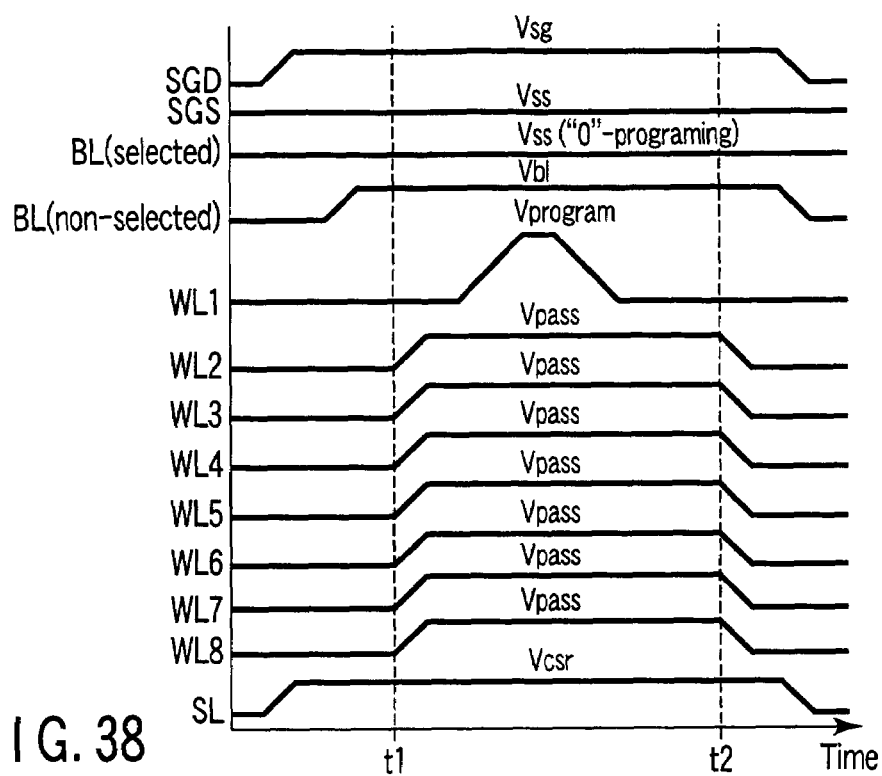
FIG. 38 is a timing chart showing a write operation of the sixth concrete example.

When performing the write in mode 1 for the selected cell, as shown in FIG. 38, like the timing chart (FIG. 36) for the memory cell not adjacent to the select gate transistor, the period during which the pass potential $V_{pass}$ is applied to the non-selected word lines WL2, WL3, ... WL8 is made a short period from the time t1 to the time t2.

Figure 39:
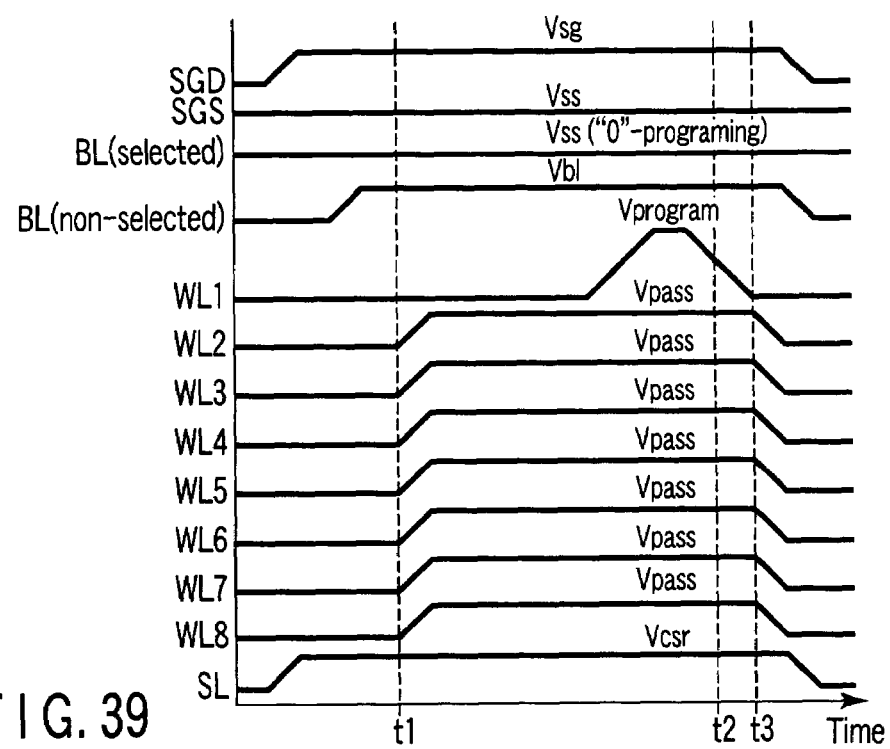
FIG. 39 is a timing chart showing a write operation of the sixth concrete example.

When performing the write in mode 2 for the selected cell, as shown in FIG. 39, like the timing chart (FIG. 37) for the memory cell adjacent to the source side select gate transistor, the period during which the pass potential $V_{pass}$ is applied to the non-selected word lines WL2, WL3, ... WL8 is made long period from the time t1 to the time t3 later than the time t2.

Finally, the write operation is terminated upon returning the potential of the select gate line SGD from the select gate potential $V_{sg}$ to the reference potential $V_{ss}$ and upon returning the potential of the source line SL from the common source potential $V_{csr}$ to the reference potential $V_{ss}$.

Thus, as for the memory cell adjacent to the drain side select gate transistor, it is possible to set the period during which the pass potential $V_{pass}$ is applied continuously in accordance with the write condition (mode) for the memory cell.

Incidentally, FIG. 38 corresponds to the mode 1 of the fourth concrete example, and FIG. 39 corresponds to the mode 2 of the fourth concrete example.

Here, for instance, in the case of executing the mode 3 of the fourth concrete example, the potential of the non-selected word lines WL2, WL3, . . . WL8 is made the reference potential $V_{ss}$ from the pass potential $V_{pass}$ at the time later than the time t2 (the same time as the time t2 of FIG. 38) and earlier than the time t3 (the same time as the time t3 of FIG. 39).

5. Summary

The summary of the examples of the present invention is as follows.

(1) Firstly, as for the timing when the selected word line is caused to reach the write potential $V_{program}$, the time in mode 2 is later than the time in mode 1, while the time in mode 3 is later than that in mode 1 and earlier than that in mode 2.

As described above, since it is possible to suppress the channel potential $V_{ch}$ in the non-selected cell unit to a low value at the time point when the wrong write caused by hot electrons is most easily generated, it is possible to contribute to improvement of reliability of a semiconductor memory due to prevention of the wrong write.

Further, in addition to such configuration, concerning the timing to increase the potential of the selected word line, if the time in mode 2 is later than that in mode 1, while the time in mode 3 is later than that in mode 1 and earlier than that in mode 2, it is possible to prevent the wrong write caused by hot electrons generated in a process for increasing the potential of the selected word line.

(2) A nonvolatile semiconductor memory related to examples of the present invention, for instance, as described in the first embodiment (FIGS. 5 to 9), is provided with a NAND string comprised a plurality of memory cells connected serially, two select gate transistors each of which is connected to each end of the NAND string, and a write control circuit which makes the first write condition for a selected cell when one of two memory cells adjacent to the two select gate transistors is defined as a selected cell different from the second write condition for a selected cell when a memory cell not adjacent to the two select gate transistors is defined as a selected cell, among a plurality of memory cells.

As described above, it is possible to prevent effectively the wrong write for the non-selected cell sharing the selected cell and the word line, by making the write condition for the selected cell different in accordance with the position of the selected cell serving as an object of the write, among a plurality of memory cells constituting the NAND string.

That is, even though the position of the non-selected cell connected to the selected word line in common to which the write potential is applied is adjacent to the select gate transistor, it is possible to suppress the generation of hot electrons caused by the interband tunnel current by controlling the write condition.

Figure 40:
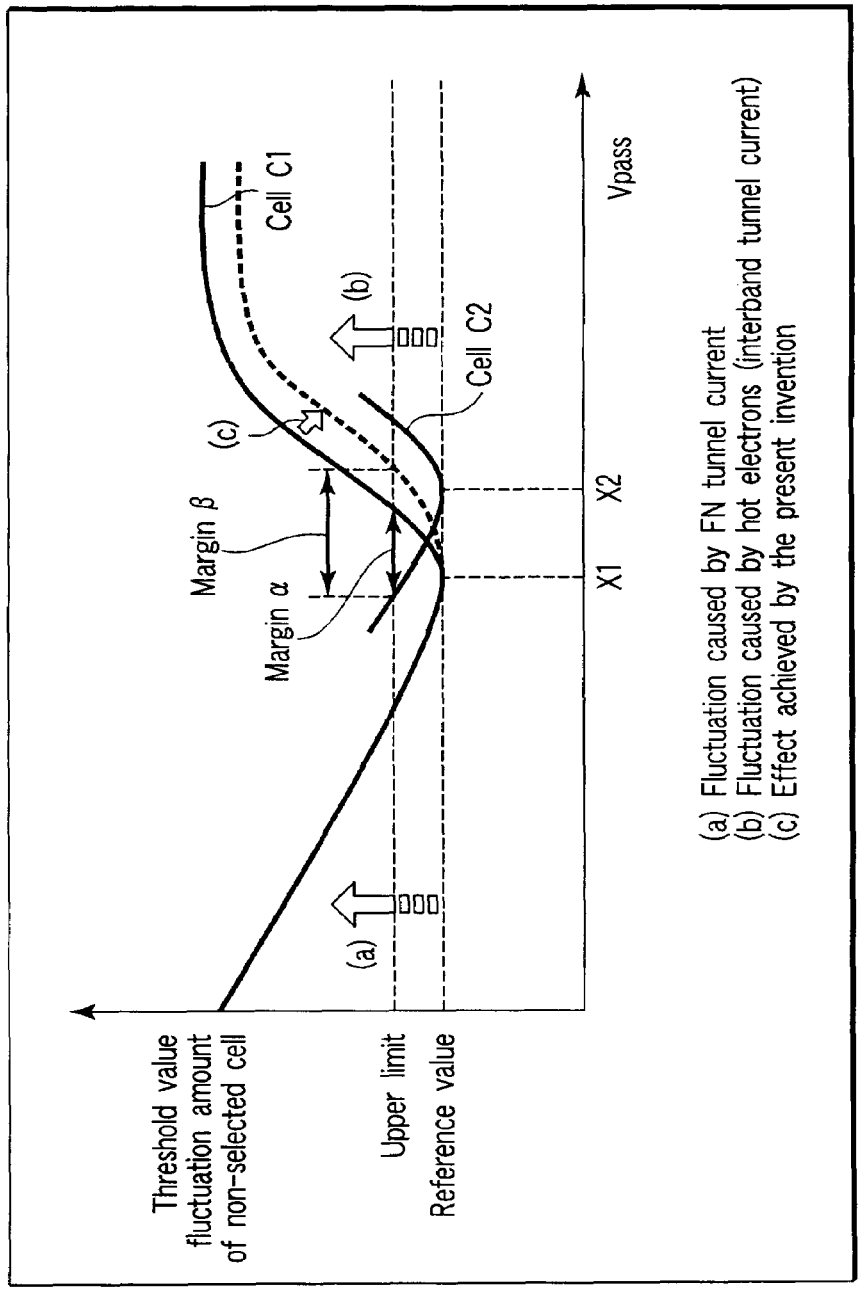
FIG. 40 is a view showing an effect related to threshold fluctuation of a non-selected cell.

Therefore, for instance, as shown by an arrow (c) of FIG. 40, concerning the non-selected cell adjacent to the select gate transistor, it is possible to decrease the threshold fluctuation amount caused by the fact that hot electrons are injected into the floating gate electrode at the time of write.

In accordance with this, it becomes possible to increase the margin of the pass voltage $V_{pass}$ in an upper limit (deviation from the reference value) of the threshold voltage in which the wrong write for the non-selected cell is not generated, from α to β. That is, even in the case where variation occurs in a characteristic of the memory cells (C1, C2 are cells whose characteristics are most different), the pass voltage $V_{pass}$ is selected from a wide range, and can be set to an optimum value.

(3) The specific condition is as follows:

As described in the first concrete example (FIGS. 12 to 16) and the fourth concrete example (FIGS. 26 to 30), the second write condition (mode 1) sets the period from the time the potential of the word line connected to the selected cell or a non-selected cell other than the selected cell begins to increase to the time the potential of the word line connected to the selected cell is caused to reach the write potential as the first period, while the first write condition (mode 2) sets the period from the time the potential of the word line connected to the selected cell or the non-selected cell begins to increase to the time the potential of the word line connected to the selected cell is caused to reach the write potential as the second period which is longer than the first period.

This is for utilizing the phenomenon that when making the word line connected to the selected cell or the non-selected cell to be at the pass potential, the channel potential of the NAND string in the cell unit connected to the non-selected bit line increases, resulting in the condition in which hot electrons are generated due to the interband tunnel current, and the channel potential gradually decreases due to a leak.

That is, when the period from making the word line connected to the selected cell or the non-selected cell to be at the pass potential to making the word line connected to the selected cell to be at the write potential is short, since the decrease in the channel potential caused by the leak is small, the channel potential at the time of applying the write potential becomes high. This is convenient in prevention of the wrong write caused by the FN tunnel current, but the occurrence of hot electrons caused by the interband tunnel current increases, and thus there is the possibility of a wrong write caused by hot electrons.

Accordingly, in the case where the write is performed for the memory cell not adjacent to the select gate transistor, there is no chance of a wrong write being caused by hot electrons because the distance between the non-selected cell to which the write potential is applied and the select gate transistor in the cell unit connected to the non-selected bit line is long. Therefore, in consideration of prevention of a wrong write caused by the FN tunnel current, the period from making the word line connected to the selected cell or the non-selected cell to be at the pass potential to making the word line connected to the selected cell to be at the write potential is made short.

Further, in the case where the write is performed for the memory cell adjacent to the select gate transistor, the period from making the word line connected to the selected cell or the non-selected cell to be at the pass potential to making the word line connected to the selected cell to be at the write potential is made long. Accordingly, since the decrease in the channel potential caused by the leak becomes large, generation of hot electrons caused by the interband tunnel current decreases, and also in the non-selected cell to which the write potential is applied, there is no possibility of the wrong write due to the presence of hot electrons.

(4) Further, as described in the second concrete example (FIGS. 17 to 21), the second write condition (mode 1) causes the potential of word line connected to the selected cell to increase to the write potential while taking the first period, and the first write condition (mode 2) causes the potential of the word line connected to the selected cell to increase to the write potential while taking the second period longer than the first period.

Further, concerning the time at which the word line connected to the selected cell is caused to reach the write potential, the time of the first write condition (mode 2) is made later than the time of the second write condition (mode 1).

Like the case of the above (2), this is for utilizing the phenomenon that the channel potential of the NAND string in the cell unit connected to the non-selected bit line gradually decreases due to the leak.

That is, when the period for increasing the potential of the word line connected to the selected cell to the write potential is short, since decreasing amount of the channel potential caused by the leak is small, the final channel potential becomes high, which is convenient in prevention of the wrong write caused by the FN tunnel current. However, generation of hot electrons due to the interband tunnel current increases, and thus there is the chance of a wrong write.

Accordingly, in the case where the write is performed for the memory cell not adjacent to the select gate transistor, there is no possibility of a wrong write occurring due to the presence of hot electrons because the distance between the non-selected cell to which the write potential is applied and the select gate transistor in the cell unit connected to the non-selected bit line is long. Therefore, in consideration of prevention of the wrong write caused by the FN tunnel current, the period for increasing the potential of the word line connected to the selected cell to the write potential is made short.

Further, in the case where the write is performed for the memory cell adjacent to the select gate transistor, the period during which the potential of the word line connected to the selected cell is caused to increase to the write potential is made long. In this manner, the decreasing amount of the channel potential caused by the leak becomes large. Therefore, occurrence of the hot electrons caused by the interband tunnel current decreases, and also in the non-selected cell to which the write potential is applied, the fear of the wrong write caused by the hot electrons is eliminated.

(5) Further, as described in the third concrete example (FIGS. 22 to 25), the second write condition (mode 1) is one in which the potential of the word line connected to the selected cell is caused to reach the write potential with a plurality of steps, while the first write condition (mode 2) is one in which the potential of the word line connected to the selected cell is caused to reach the write potential without a plurality of steps.

This is for utilizing the phenomenon that when supplying the pass potential to the word line connected to the selected cell, the channel potential of the NAND string in the cell unit connected to the non-selected bit line increases, resulting in the state of generating hot electrons caused by the interband tunnel current.

That is, when supplying the pass potential before supplying the write potential for the selected cell, increasing rate of the channel potential of the NAND string in the cell unit connected to the non-selected bit line is improved. However, occurrence of the hot electrons caused by the interband tunnel current increases, and thus there is a chance of the wrong write being caused by the presence of hot electrons.

Accordingly, in the case where the write is performed for the memory cell not adjacent to the select gate transistor, there is no chance of the wrong write being caused by hot electrons because the distance between the non-selected cell to which the write potential is applied and the select gate transistor in the cell unit connected to the non-selected bit line is long. Therefore, in consideration of prevention of the wrong write caused by the FN tunnel current, the potential of the word line connected to the selected cell is caused to reach the write potential with a plurality of steps.

Further, in the case where the write is performed for the memory cell adjacent to the select gate transistor, the potential of the word line connected to the selected cell is caused to reach the write potential without a plurality of steps. In this manner, since increasing rate of the channel potential of the NAND string in the cell unit connected to the non-selected bit line decreases, the occurrence of hot electrons caused by the interband tunnel current decreases. Thus, also in the non-selected cell to which the write potential is applied, there is no chance of the wrong write being occurring due to the presence of hot electrons.

(6) Further, as described in the fifth concrete example (FIGS. 31 to 35), the second write condition (mode 1), during the first period, makes the potential of the word line connected to the selected cell the write potential, while the first write condition (mode 2), during the second period shorter than the first period, makes the potential of the word line connected to the selected cell the write potential.

This is for utilizing the phenomenon that, during the period in which the write potential is applied to the word line connected to the selected cell, the channel potential of the NAND string in the cell unit connected to the non-selected bit line is the highest, and hot electrons caused by the interband tunnel current are generated.

That is, if the period during which the write potential is applied to the word line connected to the selected cell is long, the period during which the hot electrons caused by the interband tunnel current are generated also becomes long, and thus there occurs the chance of the wrong write caused by the presence of hot electrons.

Accordingly, in the case where the write is performed for a memory cell not adjacent to the select gate transistor, there is no chance of the wrong write being caused by hot electrons because the distance between the non-selected cell to which the write potential is applied and the select gate transistor in the cell unit connected to the non-selected bit line is long. Therefore, in consideration of prevention of the wrong write caused by the FN tunnel current, the period during which the write potential is applied to the word line connected to the selected cell is made long.

Further, in the case where the write is performed for the memory cell adjacent to the select gate transistor, the period during which the write potential is applied to the word line connected to the selected cell is made short. In this manner, since also the period during which hot electrons caused by the interband tunnel current are generated becomes short, also in the non-selected cell to which the write potential is applied, there is no chance of the wrong write being caused by the presence of hot electrons.

(7) Further, as described in the sixth concrete example (FIGS. 36 to 39), the write control circuit, when one of two memory cells adjacent to two select gate transistors is defined as the selected cell, makes the potential of the word line connected to the non-selected cell other than the selected cell the pass potential during the first period, while when the memory cell not adjacent to the two select gate transistors is defined as the selected cell, the write control circuit makes the potential of the word line connected to the selected cell to be at the pass potential during the second period shorter than the first period.

Here, there is considered the point that the period during which the pass potential is applied to the word line connected to the non-selected cell other than the selected cell effects the write speed. That is, if the period during which the pass potential is applied to the word line connected to the non-selected cell is long, the write time also becomes long, and thus the write speed decreases.

Accordingly, in the case where the write is performed for a memory cell not adjacent to the select gate transistor, the write is performed with the conditions of the above described (2) to (5), and concurrently, the period during which the pass potential is applied to the word line connected to the non-selected cell is made short, to improve the write speed.

Further, in the case where the write is performed for the memory cell adjacent to the select gate transistor, the write is performed with the conditions of the above described (2) to (5), and concurrently, the period during which the pass potential is applied to the word line connected to the non-selected cell is made long.

(8) Further, the following constitution is also effective.

For instance, as described in the second embodiment (FIGS. 5 to 8 and 10), the nonvolatile semiconductor memory according to the example of the present invention is provided with the NAND string comprised a plurality of memory cells connected serially, two select gate transistors each of which is connected to each end of the NAND string, and the write control circuit which makes, among a plurality of memory cells, each of the first write condition, which is for the selected cell when the memory cell adjacent to one of the two select gate transistors is made the selected cell, and the second write condition, which is for the selected cell when the memory cell adjacent to the other one of the two select gate transistors is made the selected cell, different from the third write condition, which is for the selected cell when the memory cell not adjacent to the two select gate transistors is made the selected cell.

Further, the first write condition is made different from the second write condition.

Specifically, as described in the first concrete example (FIGS. 12 to 16) and the fourth concrete example (FIGS. 26 to 30), in the third write condition (mode 1), the period from the time the potential of the word line connected to the selected cell or the non-selected cell other than the selected cell begins to increase to the time the potential of the word line connected to the selected cell is caused to reach the write potential is defined as the first period. In the second write condition (mode 2), the period from the time the potential of the word line connected to the selected cell or the non-selected cell begins to increase to the time the potential of the word line connected to the selected cell is caused to reach the write potential is defined as the second period longer than the first period. Further, in the first write condition (mode 3), the period from the time the potential of the word line connected to the selected cell or the non-selected cell begins to increase to the time the word line connected to the selected cell is caused to reach the write potential is defined as the third period, which is shorter than the second period and longer than the first period.

Here, at the time of write, it is considered that the potential of the select gate electrode (select gate line) of the source side select gate transistor is different from the potential of the select gate electrode (select gate line) of the drain side select gate transistor.

That is, the select gate electrode of the source side select gate transistor, for instance, is set to the ground potential, while the select gate electrode of the drain side select gate transistor, for instance, is set to a higher potential than the ground potential. In this case, more hot electrons generated by the interband tunnel current are generated at the source side more largely than at the drain side of the cell unit connected to the non-selected bit line.

Accordingly, the condition (the second write condition) in the case of performing the write for the memory cell adjacent to the source side select gate transistor is made different from the condition (the first write condition) in the case of performing the write for the memory cell adjacent to the drain side select gate transistor.

Further, of course, the first and second write conditions for the selected cell, used when one of two memory cells adjacent to these two select gate transistors is defined as the selected cell, are made different from the third write condition for the selected cell, used when the memory cell not adjacent to the two select gate transistors is defined as the selected cell.

In this manner, when setting the write condition finely in accordance with the position of the memory cell, there is no chance of a wrong write being caused due to the presence of hot electrons generated by the interband tunnel current, and it is possible to contribute to realization of a high write speed due to optimization of the write potential at the time of write and optimization of waveform of the pass potential.

Based on the same reason, as described in the second concrete example (FIGS. 17 to 21), the third write condition (mode 1) causes the potential of the word line connected to the selected cell to increase to the write potential while taking the first period, the second write condition (mode 2) causes the potential of the word line connected to the selected cell to increase to the write potential while taking the second period longer than the first period, and the first write condition (mode 3) causes the word line connected to the selected cell to increase to the write potential while taking the third period longer than the first period and shorter than the second period.

Further, as for the time at which the word line connected to the selected cell is caused to reach the write potential, the second write condition (mode 2) is made later than the third write condition (mode 1). Further, the first write condition (mode 3) is made later than the third write condition (mode 1) and faster than the second write condition (mode 2).

Further, for instance, as described in the fifth concrete example (FIGS. 31 to 35), the third write condition (mode 1), during the first period, makes the potential of the word line connected to the selected cell the write potential, the second write condition (mode 2), during the second period shorter than the first period, makes the potential of the word line connected to the selected cell the write potential, and the first write condition (mode 3), during the third period shorter than the first period and longer than the second period, makes the potential of the word line connected to the selected cell the write potential.

(9) Further, the following constitution is effective.

For instance, as described in the third embodiment (FIGS. 5 to 8 and 11), the nonvolatile semiconductor memory according to the examples of the present invention is provided with the NAND string comprised a plurality of memory cells connected serially, two select gate transistors each of which is connected to each end of the NAND string, and the write control circuit which, among a plurality of memory cells, makes the condition (the first write condition) of increasing a threshold value of the selected cell when one of two memory cells adjacent to the two select gate transistors is defined as the selected cell different from the condition (the second write condition) of increasing a threshold value of the selected cell when the memory cell not adjacent to the two select gate transistors is defined as the selected cell.

That is, as for the data of the memory cell, in the case where the erase state is defined as "1", and the write state is defined as "0", there are two data programs of "1"-programming (no threshold fluctuation from the erase state) and "0"-programming (threshold increasing). Further, the wrong write for the non-selected cell in the cell unit connected to the non-selected bit line becomes a problem at the time of only "0"-programming which increases the threshold value of the memory cell.

Accordingly, the write condition is changed only when the selected cell is adjacent to the select gate transistor and the program data is "0", thereby the wrong write to the non-selected cell sharing the selected cell and the word line is prevented.

(10) Others

The examples of the present invention can be applied to a nonvolatile semiconductor memory having the cell unit comprised a select gate transistor and a memory cell in addition to a NAND type flash memory.

6. Conclusion

According to the examples of the present invention, it is possible to prevent effectively the wrong write caused by miniaturization of the memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a NAND string which includes memory cells connected in series;
two select gate transistors each of which is connected to each end of the NAND string; and
a write control circuit which makes a first write condition for a selected cell different from a second write condition for the selected cell,
wherein the first write condition is that the selected cell is one of two memory cells adjacent to the two select gate transistors, and the second write condition is that the selected cell is one of the memory cells except for two memory cells adjacent to the two select gate transistors.

2. The nonvolatile semiconductor memory according to claim 1,
wherein a period in the first write condition is longer than the period in the second condition, and the period is from a time a potential of a word line connected to the selected cell or a non-selected cell begins to increase to a time a word line connected to the selected cell becomes a write potential.

3. The nonvolatile semiconductor memory according to claim 1,
wherein the second write condition causes a word line connected to the selected cell to increase to a write potential while taking a first period,
the first write condition causes the word line to increase to the write potential while taking a second period longer than the first period, and
a time at which the word line becomes a write potential is later in the first write condition than in the second write condition.

4. The nonvolatile semiconductor memory according to claim 1,
wherein the second write condition causes a potential of a word line connected to the selected cell to reach a write potential with a plurality of steps, and
the first write condition causes a potential of the word line to reach the write potential without the plurality of steps.

5. The nonvolatile semiconductor memory according to claim 1,
wherein the second write condition makes a word line connected to the selected cell a write potential during a first period, while the first write condition makes the word line the write potential during a second period shorter than the first period.

6. The nonvolatile semiconductor memory according to claim 1,
wherein the write control circuit, when one of the two memory cells adjacent to the two select gate transistors is defined as the selected cell, makes a word line connected to a non-selected cell other than the selected cell a pass potential during a first period, and
when a memory cell not adjacent to the two select gate transistors is defined as the selected cell, the write control circuit makes the word line the pass potential during a second period shorter than the first period.

7. A nonvolatile semiconductor memory comprising:
a NAND string which includes memory cells connected in series;
a source side select gate transistor connected to one end of the NAND string;
a drain side select gate transistor connected to the other end of the NAND string; and
a write control circuit which makes a first write condition for a selected cell different from a second write condition for the selected cell,
wherein the first write condition is that the selected cell is a memory cell adjacent to the source side select gate transistor, and the second write condition is that the selected cell is a memory cell except for the memory cell adjacent to the source side select gate transistor.

8. The nonvolatile semiconductor memory according to claim 7,
wherein a period in the first write condition is longer than the period in the second condition, and the period is from a time a potential of a word line connected to the selected cell or a non-selected cell begins to increase to a time a word line connected to the selected cell becomes a write potential.

9. The nonvolatile semiconductor memory according to claim 7,
wherein the second write condition causes a word line connected to the selected cell to increase to a write potential while taking a first period,
the first write condition causes the word line to increase to the write potential while taking a second period longer than the first period, and
a time at which the word line becomes a write potential is later in the first write condition than in the second write condition.

10. The nonvolatile semiconductor memory according to claim 7,
wherein the second write condition causes a potential of a word line connected to the selected cell to reach a write potential with a plurality of steps, and
the first write condition causes a potential of the word line to reach the write potential without the plurality of steps.

11. The nonvolatile semiconductor memory according to claim 7,
wherein the second write condition makes a word line connected to the selected cell a write potential during a first period, while the first write condition makes the word line the write potential during a second period shorter than the first period.

12. The nonvolatile semiconductor memory according to claim 7,
wherein the write control circuit, when one of the two memory cells adjacent to the two select gate transistors is defined as the selected cell, makes a word line connected to a non-selected cell other than the selected cell a pass potential during a first period, and
when a memory cell not adjacent to the two select gate transistors is defined as the selected cell, the write control circuit makes the word line the pass potential during a second period shorter than the first period.

13. The nonvolatile semiconductor memory according to claim 7,
wherein the second write condition is a write condition for the selected cell used when a memory cell adjacent to the drain side select gate transistor is defined as the selected cell.

14. A nonvolatile semiconductor memory comprising:
a NAND string which includes memory cells connected in series;
a source side select gate transistor connected to one end of the NAND string;
a drain side select gate transistor connected to the other end of the NAND string; and
a write control circuit which makes a first write condition for a selected cell different from a second write condition for the selected cell,
wherein the first write condition is that the selected cell is a memory cell adjacent to the drain side select gate transistor, and the second write condition is that the selected cell is a memory cell except for the memory cell adjacent to the drain side select gate transistor.

15. The nonvolatile semiconductor memory according to claim 14,
wherein a period in the first write condition is longer than the period in the second condition, and the period is from a time a potential of a word line connected to the selected cell or a non-selected cell begins to increase to a time a word line connected to the selected cell becomes a write potential.

16. The nonvolatile semiconductor memory according to claim 14,
wherein the second write condition causes a word line connected to the selected cell to increase to a write potential while taking a first period,
the first write condition causes the word line to increase to the write potential while taking a second period longer than the first period, and
a time at which the word line becomes a write potential is later in the first write condition than in the second write condition.

17. The nonvolatile semiconductor memory according to claim 14,
wherein the second write condition causes a potential of a word line connected to the selected cell to reach a write potential with a plurality of steps, and
the first write condition causes a potential of the word line to reach the write potential without the plurality of steps.

18. The nonvolatile semiconductor memory according to claim 14,
wherein the second write condition makes a word line connected to the selected cell a write potential during a first period, while the first write condition makes the word line the write potential during a second period shorter than the first period.

19. The nonvolatile semiconductor memory according to claim 14,
wherein the write control circuit, when one of the two memory cells adjacent to the two select gate transistors is defined as the selected cell, makes a word line connected to a non-selected cell other than the selected cell a pass potential during a first period, and
when a memory cell not adjacent to the two select gate transistors is defined as the selected cell, the write control circuit makes the word line the pass potential during a second period shorter than the first period.

20. The nonvolatile semiconductor memory according to claim 14,
wherein the second write condition is a write condition for the selected cell used when a memory cell adjacent to the source side select gate transistor is defined as the selected cell.

* * * * *